(12) United States Patent
Aritome

(10) Patent No.: US 9,312,241 B2
(45) Date of Patent: Apr. 12, 2016

(54) SEMICONDUCTOR DEVICE

(71) Applicant: SK hynix Inc., Gyeonggi-do (KR)

(72) Inventor: Seiichi Aritome, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/321,503

(22) Filed: Jul. 1, 2014

(65) Prior Publication Data

US 2015/0243634 A1 Aug. 27, 2015

(30) Foreign Application Priority Data

Feb. 27, 2014 (KR) .......................... 10-2014-0023437

(51) Int. Cl.

| | | |
|---|---|---|
| *H01L 23/48* | (2006.01) | |
| *H01L 23/02* | (2006.01) | |
| *H01L 25/065* | (2006.01) | |
| *G11C 5/02* | (2006.01) | |
| *G11C 5/06* | (2006.01) | |
| *H01L 23/532* | (2006.01) | |
| *H01L 23/525* | (2006.01) | |

(52) U.S. Cl.
CPC ............ *H01L 25/0657* (2013.01); *G11C 5/025* (2013.01); *G11C 5/063* (2013.01); *H01L 23/481* (2013.01); *H01L 23/525* (2013.01); *H01L 23/53214* (2013.01); *H01L 23/53228* (2013.01); *H01L 2224/16145* (2013.01); *H01L 2224/32145* (2013.01); *H01L 2224/48091* (2013.01); *H01L 2224/48145* (2013.01); *H01L 2224/48227* (2013.01); *H01L 2224/73265* (2013.01); *H01L 2225/0651* (2013.01); *H01L 2225/06506* (2013.01); *H01L 2225/06541* (2013.01); *H01L 2225/06562* (2013.01); *H01L 2225/06572* (2013.01)

(58) Field of Classification Search
CPC .......................... H01L 23/481; H01L 25/0657
USPC .................... 257/686, 773, 786, 758, E23.145
See application file for complete search history.

(56) References Cited

U.S. PATENT DOCUMENTS

| | | | | |
|---|---|---|---|---|
| 5,229,647 | A * | 7/1993 | Gnadinger ............... | G11C 5/00 257/686 |
| 6,174,803 | B1 * | 1/2001 | Harvey ............. | H01L 21/76895 257/758 |
| 6,403,448 | B1 * | 6/2002 | Reddy .................... | G11C 5/025 438/113 |
| 6,717,270 | B1 * | 4/2004 | Downey et al. ................ | 257/758 |
| 6,897,570 | B2 * | 5/2005 | Nakajima et al. ............. | 257/786 |
| 7,276,799 | B2 * | 10/2007 | Lee et al. ...................... | 257/777 |
| 7,576,431 | B2 * | 8/2009 | Takahashi ...................... | 257/777 |
| 7,732,908 | B2 * | 6/2010 | Nishiyama .......... | H01L 23/3121 257/686 |
| 2006/0065969 | A1 * | 3/2006 | Antol et al. .................... | 257/700 |
| 2010/0181661 | A1 * | 7/2010 | Takemoto ............... | H01L 24/24 257/686 |

\* cited by examiner

*Primary Examiner* — Nitin Parekh

(74) *Attorney, Agent, or Firm* — IP & T Group LLP

(57) ABSTRACT

A semiconductor device includes an operation circuit formed on a top surface of a semiconductor substrate, a memory array formed over the operation circuit, an inner pad group formed on an intermediate layer between the operation circuit and the memory array and coupled to the operation circuit, a first outer pad group formed on a bottom surface of the semiconductor substrate, and a wiring structure passing through the semiconductor substrate, and coupling the inner pad group to the first outer pad group.

18 Claims, 22 Drawing Sheets

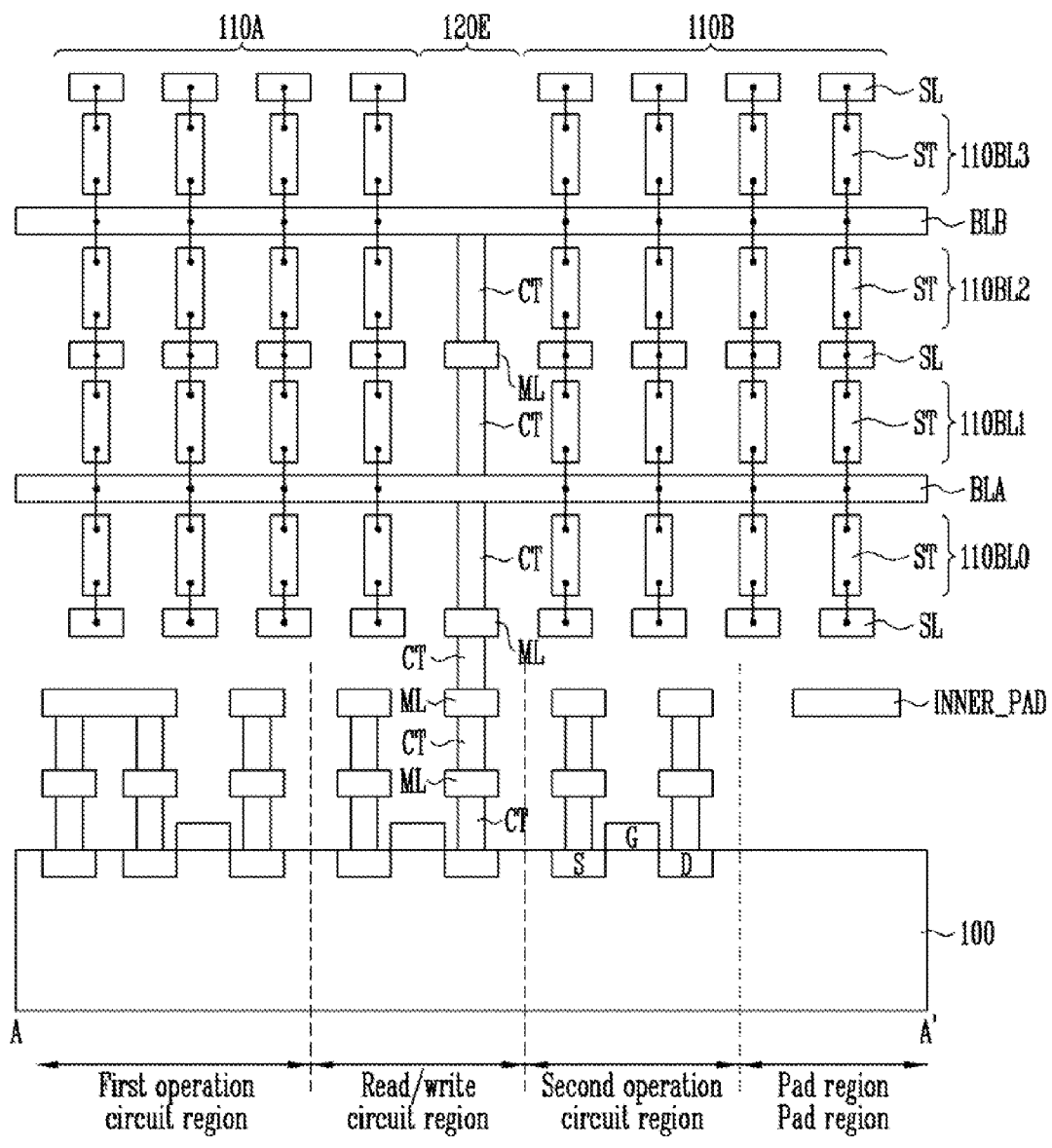

SEMICONDUCTOR DEVICE

CROSS-REFERENCE TO RELATED APPLICATION

The present application claims priority to Korean patent application number 10-2014-0023437, filed on Feb. 27, 2014, the entire disclosure of which is incorporated herein in its entirety by reference.

BACKGROUND

1. Technical Field

Various embodiments relate generally to a semiconductor device and, more particularly, to a semiconductor device including a pad.

2. Related Art

One way to increase data storage capacity is to provide a larger number of memory cells within a predetermined area. In addition, a plurality of semiconductor substrates may be stacked in order to reduce the size of a semiconductor chip. Each of the semiconductor substrates may include a pad. A circuit board and the pad of the semiconductor substrate may be coupled by wire bonding. In order to expose pads of the semiconductor substrates, the semiconductor substrates may be stacked and offset from each other by a width allowing the pads of the semiconductor substrates to be exposed. As a result, as the number of stacked semiconductor substrates increases and the size of the semiconductor chip may increase.

BRIEF SUMMARY

Various embodiments relate to a semiconductor device having an increased number of memory cells formed over a semiconductor substrate and with minimized increase in size of the semiconductor chip as the number of semiconductor substrates are stacked.

A semiconductor device according to an embodiment of the present invention may include an operation circuit formed on a top surface of a semiconductor substrate, a memory array formed over the operation circuit, an inner pad group formed on an intermediate layer between the operation circuit and the memory array and coupled to the operation circuit, a first outer pad group formed on a bottom surface of the semiconductor substrate, and a wiring structure passing through the semiconductor substrate and coupling the inner pad group to the first outer pad group.

A semiconductor device according to another embodiment of the present invention may include a circuit board, semiconductor substrates, in each of which an inner pad group and a memory array are sequentially stacked on a top surface thereof and an outer pad group is formed on a bottom surface thereof, wiring structures respectively formed in the semiconductor substrates, wherein each of the wiring structures passes through each of the semiconductor substrates to couple the inner pad group to the outer pad group, and connecting members each coupling the circuit board to the outer pad group of each of the semiconductor substrates, wherein the semiconductor substrates are turned over and stacked on the circuit board.

A semiconductor device according to yet another embodiment of the present invention may include a circuit board, semiconductor substrates, in each of which an inner pad group and a memory array are sequentially stacked on a top surface thereof and first and second outer pad groups are electrically coupled to each other on a bottom surface thereof, wherein the semiconductor substrates are stacked on the circuit board, wiring structures passing through the semiconductor substrates so that the inner pad group of each of the semiconductor substrates is coupled to the first outer pad group thereof, wherein each of the wiring structures is formed in each of the semiconductor substrates, and connecting members each coupling the circuit board to the first outer pad group of each of the semiconductor substrates in an odd layer, wherein the semiconductor substrates in the odd layer are turned over and stacked.

BRIEF DESCRIPTION OF THE DRAWINGS

FIGS. 4A and 46 are three-dimensional circuit diagrams illustrating the memory array shown in FIG. 1;

FIGS. 5A and 5B are cross-sectional views illustrating a semiconductor device according to an embodiment of the present invention;

DETAILED DESCRIPTION

Hereinafter, various embodiments are described in detail with reference to the accompanying drawings. The figures are provided to allow those having ordinary skill in the art to understand the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Furthermore, 'connected/coupled' represents that one component is directly coupled to another component or indirectly coupled through another component. In this specification, a singular form may include a plural form, and vice versa, as long as it is not specifically mentioned in a sentence. Furthermore, 'include/comprise' or 'including comp sing' used in the specification represents that one or more components, steps, operations, and elements exists or are added.

It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

Figure 1:
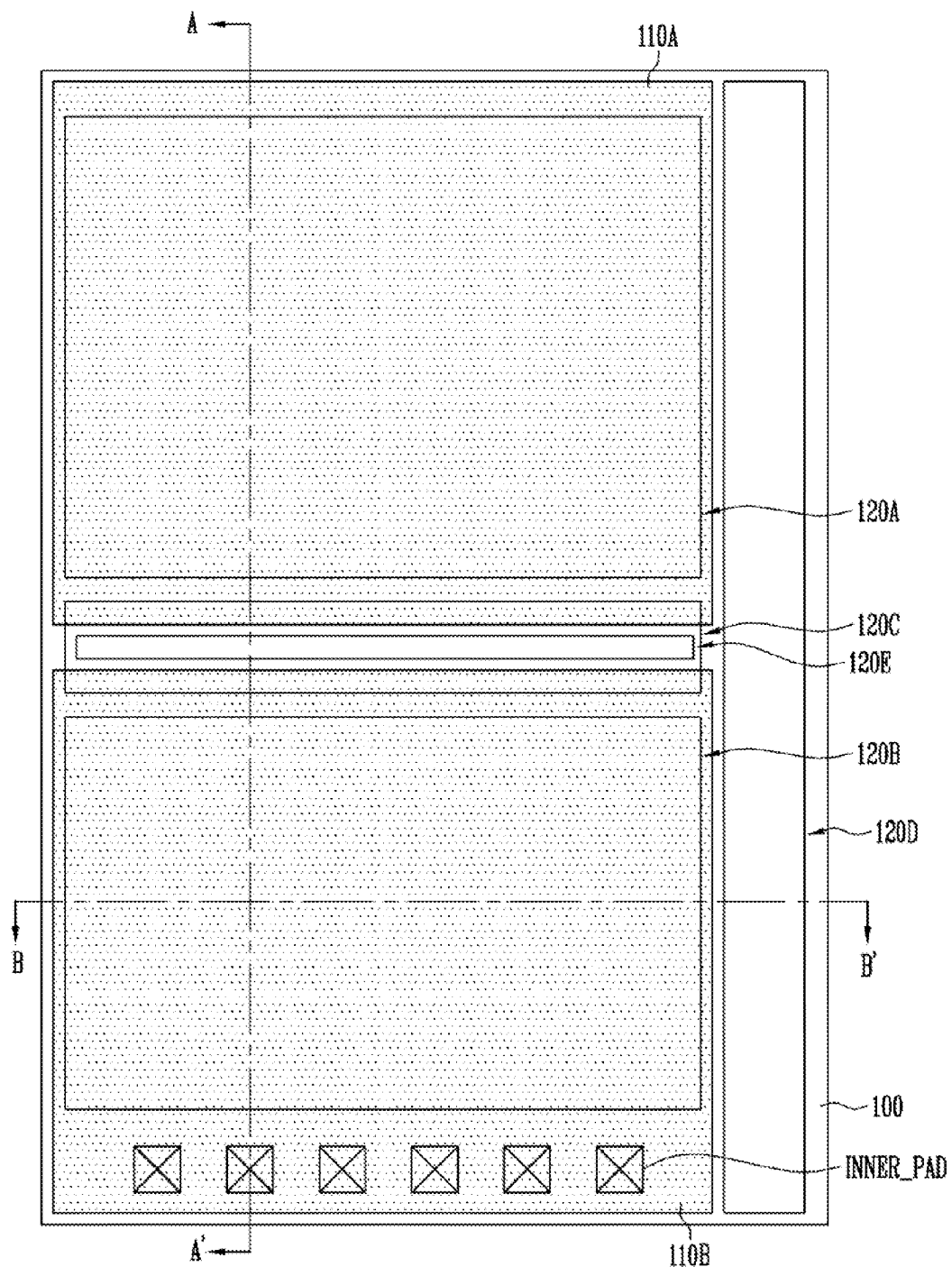
FIG. 1 is a plan view illustrating a semiconductor substrate according to an embodiment of the present invention.

FIG. 1 is a plan view illustrating a semiconductor substrate according to an embodiment of the present invention.

Referring to FIG. 1, a semiconductor substrate 100 may include operation circuits 120A to 120D. Memory arrays 110A and 110B may be formed over the operation circuits 120A to 120D. In addition, an inner pad INNER_PAD group may be formed on an intermediate layer between the operation circuits 120A to 120D and the memory arrays 110A and 110B. A surface of the semiconductor substrate 100, over which the operation circuits 120A to 120D, the inner pad INNER_PAD group and the memory arrays 110A and 110B are formed, may be defined as a top surface of the semiconductor substrate 100.

The operation circuits 120A to 120D may be formed over the entire top surface of the semiconductor substrate 100. The memory arrays 110A and 110B may be formed on most of the upper area of the operation circuits 120A to 120D. Therefore, the area of the memory arrays 110A and 110B may almost equal to that of the semiconductor substrate 100. As a result, the number of memory cells may be maximized within the area of the memory arrays 110A and 110B.

The operation circuits 120A and 120B may include a control circuit, a voltage supply circuit and an input/output circuit. The operation circuit 120C may include a read/write circuit. The read/write circuit may be coupled to bit lines (not illustrated) of the memory arrays 110A and 110B in a region 120E between the memory arrays 110A and 110B. The operation circuit 120C including the read/write circuit may be formed at the center of the semiconductor substrate 100. The operation circuit 120D may include a word line driver.

The voltage supply circuit may generate operating voltages, such as a program voltage, a read voltage, an erase voltage, a pass voltage, a selection voltage, a common source voltage and a verify voltage, for a read operation, a program loop or an erase loop. The word line driver may transfer the operating voltages to local lines, for example, a word line, selection line and a common source line (not illustrated) of a selected memory block of the memory blocks (not illustrated). The read/write circuit may be coupled to the memory blocks through the bit lines (not illustrated). In addition, the read/write circuit may selectively precharge or discharge selected bit lines in response to data stored in memory cells during a program operation, and sense voltage variations or current variations of the selected bit lines during a read operation, and latch the data stored in the memory cells. The read/write circuit may include a page buffer. The input/output circuit may transfer a command signal and an address signal, which are input from an external source, to the control circuit. In addition, the input/output circuit may transfer the externally input data to the read/write circuit during the program operation or output the data, read from the memory cells, externally during the read operation. The control circuit may control the voltage supply circuit, the word line driver, the read/write circuit and the input/output circuit.

Figure 2:
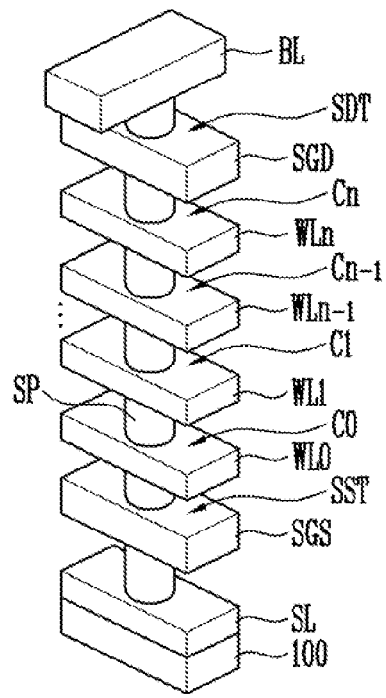
FIG. 2 is a three-dimensional view illustrating a memory string included in a memory array shown in FIG.
Figure 3:
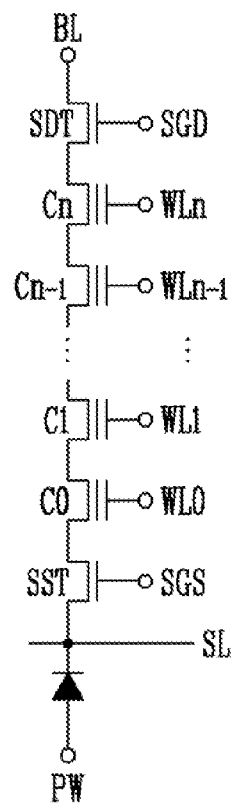
FIG. 3 is a circuit diagram illustrating a memory string included in a memory array shown in FIG. 1.

The memory array may have a three-dimensional structure. More specifically, FIG. 2 is a three-dimensional view illustrating a memory string included in the memory array 110A and 110B shown in FIG. 1. FIG. 3 is a circuit diagram illustrating the memory string included in the memory array 110A and 110B shown in FIG. 1.

Referring to FIGS. 2 and 3, the common source line SL may be formed over the semiconductor substrate 100, in which a P well PW is formed. A vertical channel layer SP may be formed on the common source line SL. A top portion of the vertical channel layer SP may be coupled to a bit line BL. The vertical channel layer SP may include polysilicon. A plurality of conductive layers SGS, WL0 to WLn, and SGD may surround the vertical channel layer SP at different heights. Multi-layer (not illustrated), including a charge storage layer, may be formed on the surface of the vertical channel layer SP. The multi-layer may also be formed between the vertical channel layer SP and the conductive layers SGS, WL0 to WLn and SGD.

The lowermost conductive layer may be a source selection line SGS or first selection line, and the uppermost conductive layer may be a drain selection line SGD or second selection line. The conductive layers between the source and drain selection lines SGS and SGD may be word lines WL0 to WLn. In other words, the conductive layers SGS, WL0 to WLn, and SGD may be formed in a plurality of layers over the semiconductor substrate, and the vertical channel layer SP passing through the conductive layers SGS, WL0 to WLn, and SGD may be coupled in a vertical direction between the bit line BL and the common source line SL formed over the semiconductor substrate.

A drain selection transistor SDT or second selection transistor may be formed where the uppermost conductive layer SGD surrounds the vertical channel layer SP. A source selection transistor SST or first selection transistor may be formed where the lowermost conductive layer SGS surrounds the vertical channel layer SP. Memory cells C0 to Cn may be formed where intermediate conductive layers WL0 to WLn surround the vertical channel layer SP.

Therefore, the memory string configured as described above may include the source selection transistor SST, the memory cells C0 to Cn and the drain selection transistor SDT, which are coupled in the vertical direction to the substrate between the common source line SL and the bit line BL. The source selection transistor SST may electrically couple the memory cells C0 to Cn to the common source line SL in response to a first selection signal applied to the first selection line SGS. The drain selection transistor SDT may electrically couple the memory cells C0 to Cn to the bit line BL in response to a second selection signal applied to the second selection line SGS.

Figure 4A:
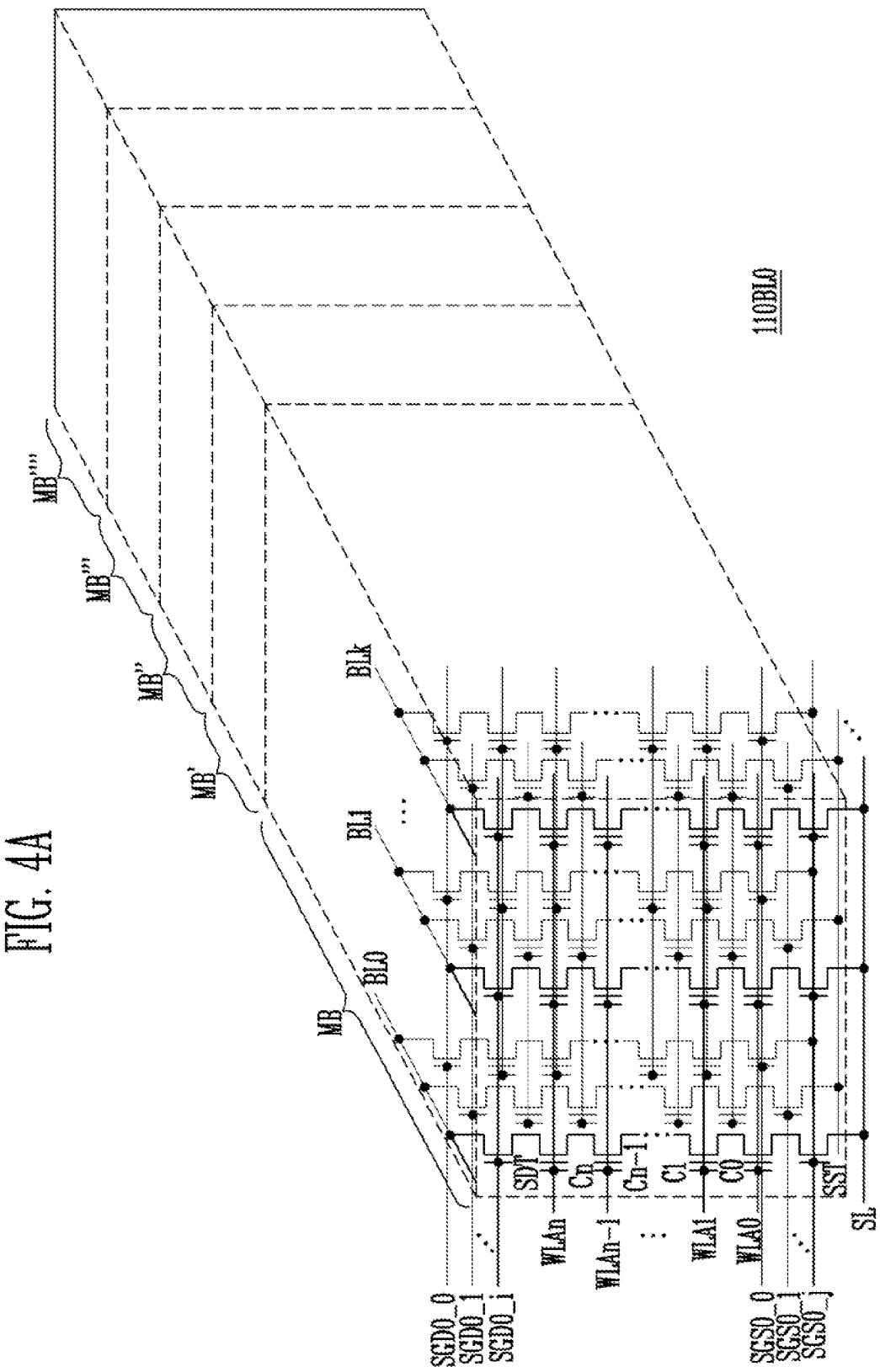
Figure 4B:
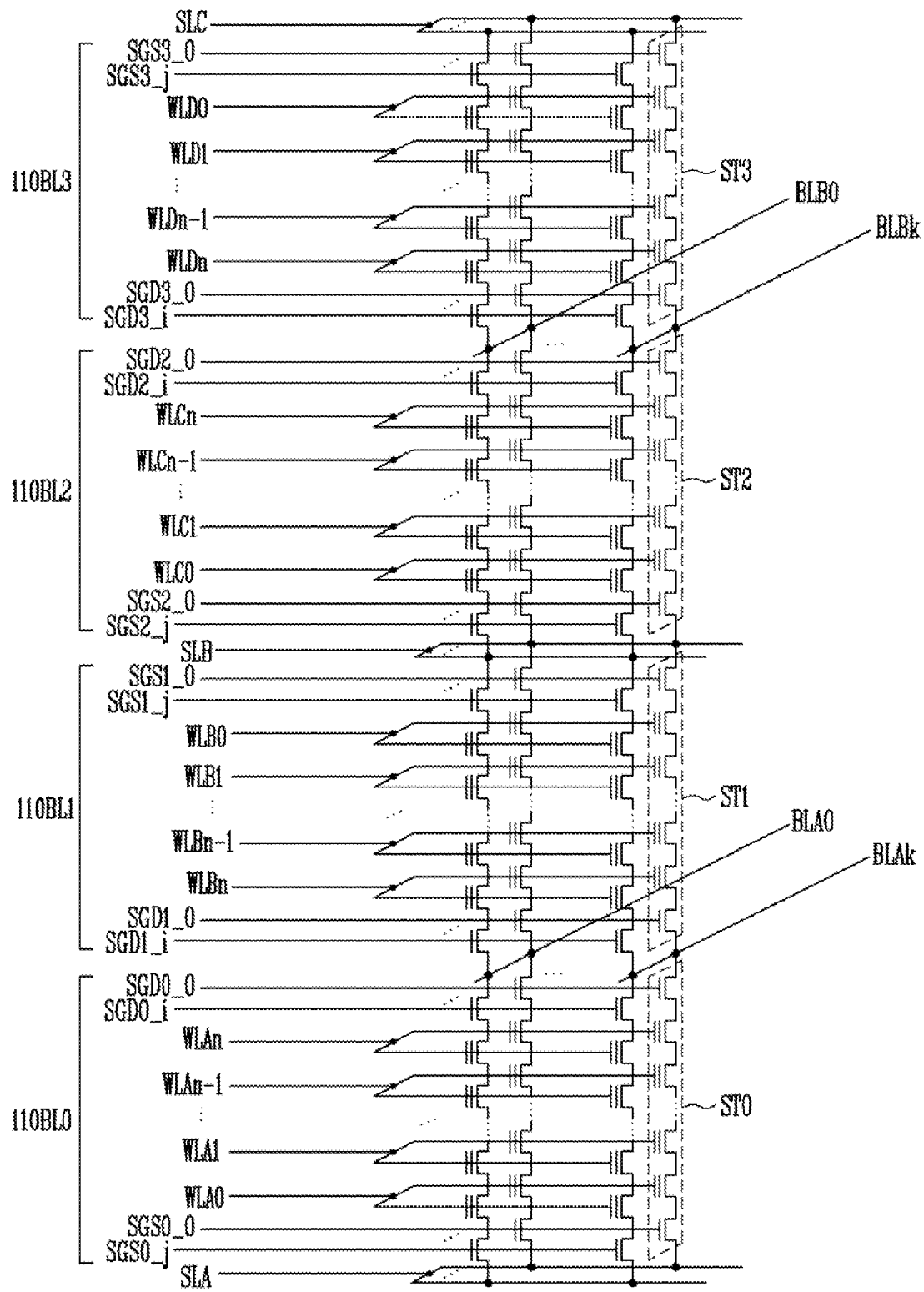

FIGS. 4A and 4B are three-dimensional circuit diagrams illustrating the memory array 110A and 110B shown in FIG. 1.

Referring to FIG. 4A, a memory block layer 110BL0 may include a plurality of memory blocks MB arranged in a horizontal direction to a substrate. Each of the memory blocks MB may include memory strings coupled between bit lines BL0 to BLk and common source lines SL. In FIG. 4A, five memory blocks MB and three bit lines are shown for illustrative purposes. In the memory block layer 110BL0, the memory blocks MB may share the bit lines BL0 to BLk, while the common source lines SL of the memory blocks MB may be separated from each other. The bit lines BL0 to BLk may extend in a direction parallel with the direction in which the memory blocks MB are horizontally arranged.

In each memory block MB, a plurality of memory strings may be coupled to each of the bit lines BL0 to BLk. Each of the memory strings may include a first selection transistor SST or a source selection transistor coupled to the common source line SL, a second selection transistor SDT or a drain selection transistor coupled to the bit line BL0, and the memory cells C0 to Cn vertically coupled in series between the first and second selection transistors SST and SDT.

The memory cells C0 to Cn included in the respective memory strings in the memory block MB may share corresponding word lines WLA0 to WLAn, respectively. Namely, the word lines WLA0 to WLAn, each of which is coupled to corresponding memory cells C0 to Cn in the horizontal direction, may be coupled to each other. In other words, in the memory block MB, word lines formed in the same layer and adjacent to each other in the horizontal direction may be coupled to each other.

Drain selection transistors SDT of memory strings coupled to different bit lines BL0 to BLk in the memory block MB may share one of the drain selection lines (e.g., SGD0_0). In other words, the drain selection transistors SDT coupled to different bit lines BL0 to BLk may be coupled to each other by one of the drain selection lines (e.g., SGD0_0). However, the drain selection transistors SDT of the memory strings coupled to the same bit line (e.g., BL0) in the memory block MB may be coupled to different drain selection lines SGD0_0 to SGD0_$i$. In other words, the drain selection lines SGD0_0 to SGD0_$i$, each of which is coupled to the drain selection transistors SDT of the memory strings coupled to the same bit lines (e.g., BL0), may be separated from each other. Therefore, the drain selection transistors SDT coupled to the same bit line (e.g., BL0) may independently operate by different operating voltages. The drain selection lines SGD0_0 to SGD0_$i$ may extend in a direction crossing the bit lines BL0 to BLk.

Similarly to the drain selection lines SGD0_0 to SGD0_$i$, the source selection transistors SST of the memory strings coupled to different bit lines BL0 to BLk in the memory block MB may share one of the source selection lines (e.g., SGS0_0). In other words, the source selection transistors SST coupled to different bit lines BL0 to BLk may be coupled to each other by one of the source selection lines (e.g., SGS0_0). However, the source selection transistors SST of the memory strings coupled to the same bit line (e.g., BL0) in the memory block MB may be coupled to different source selection lines SGS0_0 to SGS0_$j$. In other words, the source selection lines SGS0_0 to SGS0_$j$, each of which is coupled to the source selection transistors SST of the memory strings coupled to the same bit lines (e.g., BL0) may be separated from each other. Therefore, the source selection transistors SST coupled to the same bit line (e.g., BL0) may independently operate by different operating voltages. The source selection lines SGS0_0 to SGS0_$j$ may extend in a direction crossing the bit lines BL0 to BLk.

However, all source selection lines SGS0_0 to SGS0_$j$ may be coupled to each other in the memory block MB according to design variation. In addition, operating voltages applied to memory blocks MB during a read operation, a program operation and an erase operation in the memory block MB may vary depending on how the source selection lines SGS0_0 to SGS0_$j$ are connected.

In the memory block layer 110BL0, the source selection lines SGS0_0 to SGS0_$j$ the word lines WLA0 to WLAn, the drain selection lines SGD0_0 to SGD0_$i$ and the common source lines SL of the memory block MB may be separated from source selection lines (not illustrated), word lines (not illustrated), drain selection lines (not illustrated) and common source lines (not illustrated) of another memory block MB'. In other words, in the memory block layer 110BL0, the source selection lines SGS0_0 to SGS0_$j$, the word lines WLA0 to WLAn, the drain selection lines SGD0_0 to SGD0_$i$ and the common source lines SL of respective memory blocks MB may be separated from each other.

Referring to FIG. 4B, two or more of the memory block layers described with reference to FIG. 4A may be stacked. In a preferred embodiment, four memory block layers 110BL0 to 110BL3 may be stacked. Memory blocks or memory strings included in an odd memory block layer 110BL0 or 110BL2 and memory blocks or memory strings included in an even memory block layer 110BL1 or 110BL3 may share bit lines BLA0 to BLAk or BLB0 to BLBk or a common source line SLA, SLB or SLC. In other words, the lowermost memory block layer 110BL0 and the memory block layer 110BL1 located thereon may share lower bit lines BLA0 to BLAk. The uppermost memory block layer 110BL3 and the memory block layer 110BL2 located thereunder may share upper bit lines BLB0 to BLBk.

More specifically, for example, the odd memory block layer 110BL2 may share the bit lines BLB0 to BLBk with the even memory block layer 110BL3 located thereon while sharing the common source lines SLB with the even memory block layer 110BL1 located thereunder. In addition, the even memory block layer 10BL1 may share the common source lines SLB with the odd memory block layer 110BL2 located thereon while sharing the bit lines BLA0 to BLAk with the odd memory block layer 110BL0 located thereunder. Thus, the bit lines BLA0 to BLAk and the bit lines BLB0 to BLBk may be formed in different layers, and the common source lines SLA, SLB, and SLC may be formed in different layers.

As described above, in order for the memory block layers 110BL0 to 110BL3 to share the bit lines BLA0 to BLAk and BLB0 to BLBk and the common source lines SLB, the memory block layers 110BL0 to 110BL3 may be stacked so that the memory blocks included in the odd memory block layers 110BL0 and 110BL2 and the memory blocks included in the even memory block layers 110BL1 and 110BL3 may be horizontally symmetrical.

Word lines WLA0 to WLAn, WLB0 to WLBn, WLC0 to WLCn, and WLD0 to WLDn of the memory block layers 110BL0 to 110BL3 may be coupled to each other. In other words, the word lines WLA0 to WLAn, WLB0 to WLBn, WLC0 to WLCn, and WLD0 to WLDn of the memory block layers 110BL0 to 110BL3 may be vertically coupled to each other. Word lines of vertically stacked memory blocks may be vertically coupled to each other, while word lines of horizontally arranged memory blocks may be separated from each other. Source selection lines SGS0_0 to SGS0_$j$, SGS1_0 to SGS1_$j$, SGS2_0 to SGS2_$j$, and SGS3_0 to SGS3_$j$ of the memory block layers 110BL0 to 110BL3 may be selectively coupled to each other. In addition, drain selection lines SGD0_0 to SGD0_$i$, SGD1_0 to SGD1_$i$, SGD2_0 to SGD2_$i$, and SGD3_0 to SGD3_$i$ of the memory block layers 110BL0 to 110BL3 may be selectively coupled to each other. The coupling or connection relationship of the memory block layers may vary depending on coupling or connection relationship of the voltage supply circuit and the read/write circuit. Voltages applied to the word lines WLA0 to WLAn, WLB0 to WLBn, WLC0 to WLCn, and WLD0 to WLDn, the source selection lines SGS0_0 to SGS0_$j$, SGS1_0 to SGS1_$j$, SGS2_0 to SGS2_$j$, and SGS3_0 to SGS3_$j$, and the drain selection lines SGD0_0 to SGD0_$i$, SGD1_0 to SGD1_$i$, SGD2_0 to SGD2_$i$, and SGD3_0 to SGD3_$i$ of the memory block layers 110BL0 to 110BL3 may vary depending on coupling or connection relationship.

The memory block layers 110BL0 to 110BL3 may share the common source lines SLA to SLC. In other words, the common source lines SLA to SLC of the memory block layers 110BL0 to 110BL3 may be vertically coupled to each other. Similarly to the word lines WLA0 to WLAn, common source lines of different memory blocks may be coupled in the vertical direction, not in the horizontal direction.

Figure 5B:
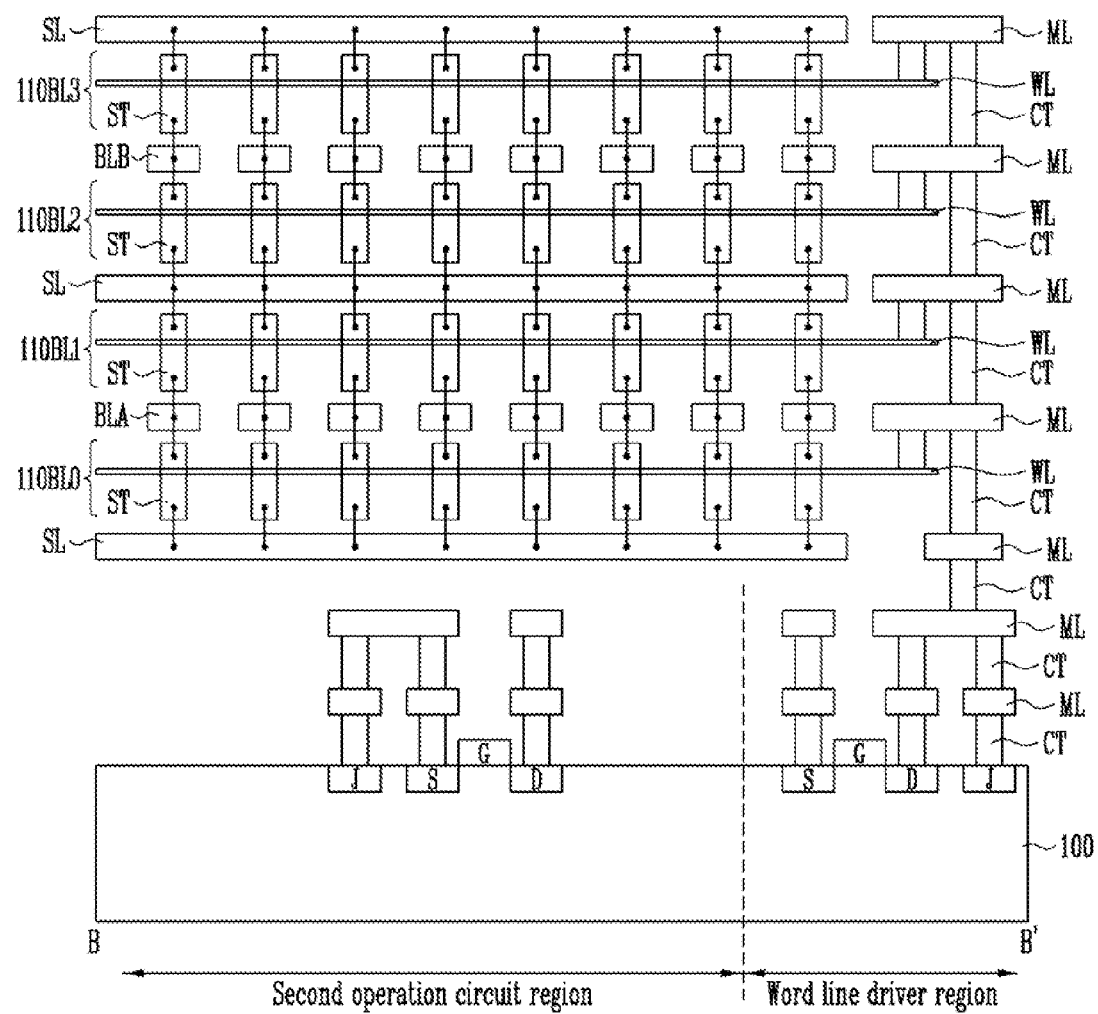

FIGS. 5A and 5B are cross-sectional views illustrating a semiconductor device according to an embodiment of the present invention. FIG. 5A is a cross-sectional view illustrating the semiconductor substrate shown in FIG. 1 and taken along direction A-A'. FIG. 5B is a view, taken in a cross-sectional direction, of the semiconductor substrate shown in FIG. 1 and taken along direction B-B'.

Referring to FIGS. 5A and 5B, semiconductor devices such as transistors forming the control circuit, the voltage supply circuit, the word line driver and the input/output circuit may be formed in first and second operation circuit regions 120A and 120B, a read/write circuit region 120C and a word line driver region 120D of the semiconductor substrate 100. In other words, a gate (G), a source(S), a drain (D) and junctions (J) may be formed in the semiconductor substrate 100, and contact plugs CT and metal lines ML for establishing electrical connections therebetween may be formed in a plurality of layers.

When the uppermost one of the metal lines ML is formed, the inner pad INNER_PAD group may also be formed. The inner pad INNER_PAD group may be electrically connected to other operation circuits as well as the semiconductor devices constituting the word line driver.

Memory arrays 110A and 110B may be formed over the semiconductor substrate 100, on which the operation circuits are formed. As illustrated in FIGS. 4A and 4B, the memory arrays 110A and 110B may include a plurality of memory blocks, and the memory blocks may be stacked in a plurality of layers. Each of the memory blocks may include the memory strings having the three-dimensional structure as described above with reference to FIGS. 2 and 3.

A lower bit line BLA shared by the first and second memory block layers 110BL0 and 110BL1 and an upper bit line BLB shared by the third and fourth memory block layers 1108L2 and 110BL3 may be electrically connected to the semiconductor devices in the read/write circuit region 120C by the contact plugs CT and the metal lines ML in the region 120E between the memory arrays 110A and 110B. The contact plug CT may be formed in the same layer as the memory string ST, and the metal lines ML may be formed in the same layer as the common source line SL. The contact plugs CT and the metal lines ML may couple the upper bit line BLB and the lower bit line BLA with the read/write circuit in parallel, or couple the upper bit line BLB and the lower bit line BLA to different read/write circuits, respectively.

In addition, the word lines WL of the memory block layers 110BL0 to 110BL3 may be coupled to the semiconductor devices forming the word line driver by the contact plugs CT and the metal lines ML in the word line driver region.

The inner pads INNER_PAD may be arranged over one edge of the semiconductor substrate 100, and located under the memory array 110B. In other words, the inner pads INNER_PAD may be located in an intermediate layer between the operation circuits 120A to 120D and the memory arrays 110A and 110B.

Figure 6:
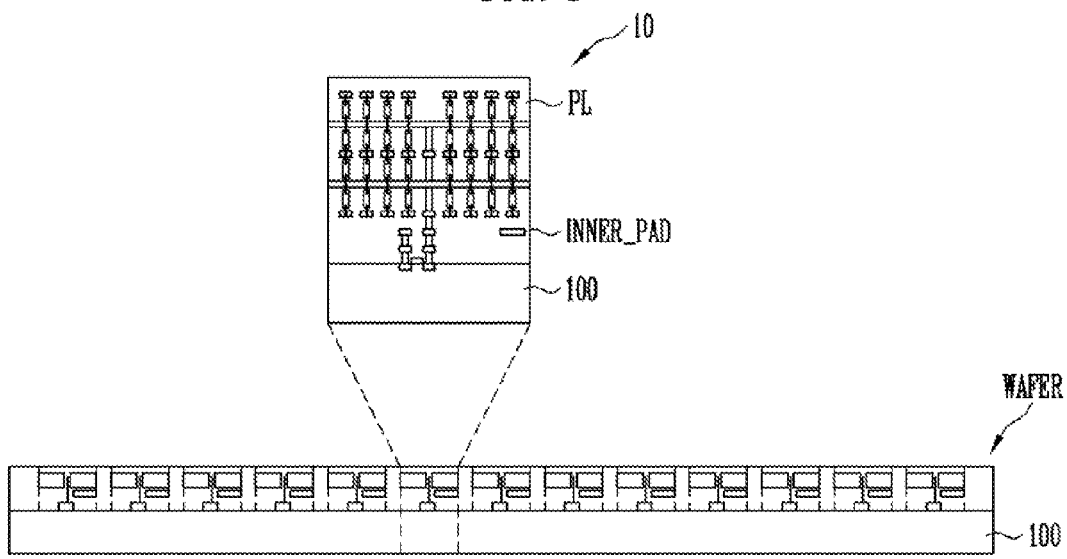
FIGS. 6 to 14 are views illustrating a packaging process of a semiconductor device according to an embodiment of the present invention.
Figure 14:
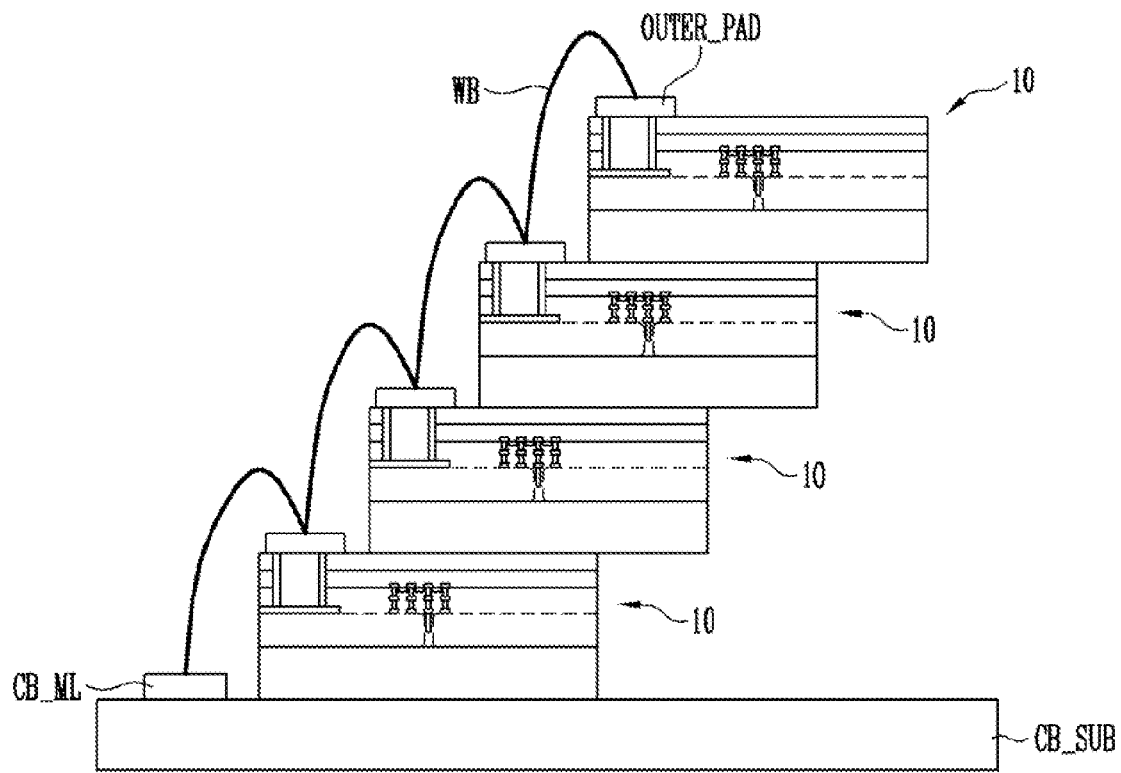

Hereinafter, packaging process of the above-described semiconductor substrate according to an embodiment of the present invention is described. FIGS. 6 and 14 are views illustrating a packaging process of the semiconductor device according to an embodiment of the present invention.

Referring to FIG. 6, a passivation layer PL may be formed over the semiconductor substrate 100 described above with reference to FIGS. 5A and 5B. The semiconductor substrate 100 shown in FIGS. 5A and 5B may be a single die 10 in a wafer WAFER. A plurality of dies 10 may be formed in the wafer WAFER.

Figure 7:
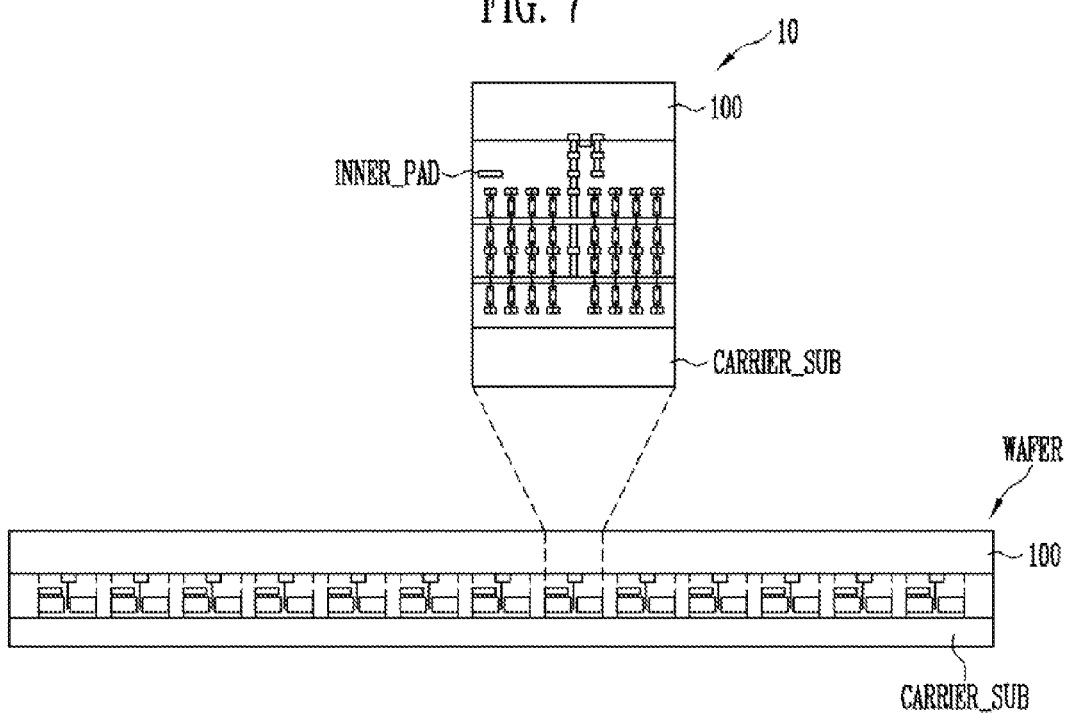

Referring to FIG. 7, a carrier substrate CARRIER_SUB may be attached to a top surface of the wafer WAFER to the passivation layer PL formed in each die 10. The carrier substrate CARRIER_SUB may also serve as a protective plate for protecting the top surface of the wafer WAFER, on which memory arrays are formed. The wafer WAFER may be turned over and attached to the carrier substrate CARRIER_SUB. After the carrier substrate CARRIER_SUB is attached to the wafer WAFER, the wafer WAFER may be turned over.

Figure 8:
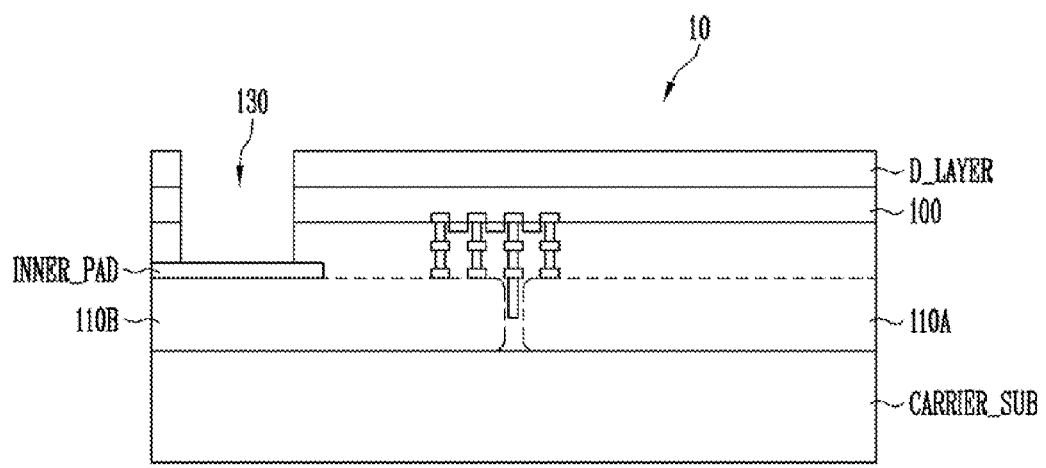
Figure 9:
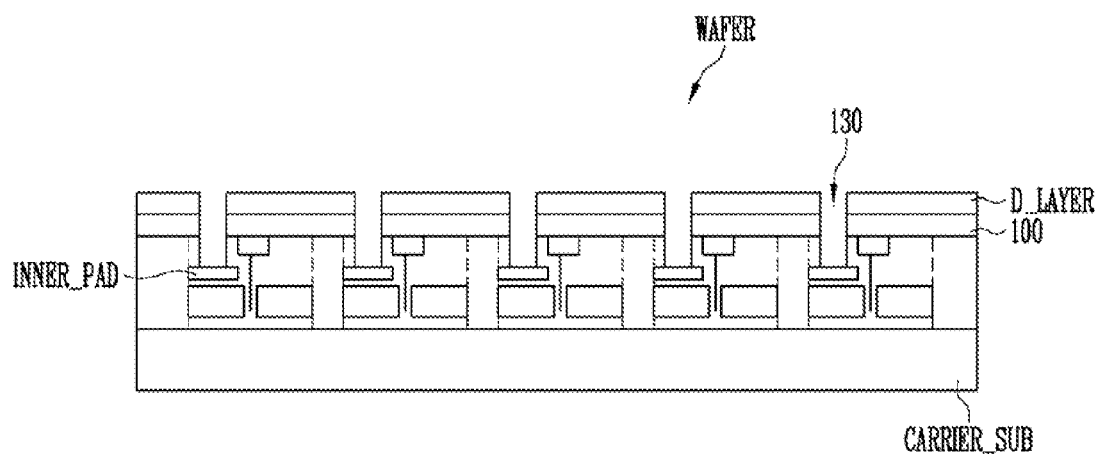

Referring to FIGS. 8 and 9, when the wafer WAFER is turned over, the semiconductor substrate 100 may be located above the carrier substrate CARRIER_SUB. In order to reduce the thickness of the semiconductor substrate 100, a bottom surface of the semiconductor substrate 100 located above the carrier substrate CARRIER_SUB may be etched. In other words, the entire bottom surface of the wafer WAFER may be etched. The bottom surface of the wafer WAFER or the semiconductor substrate 100 may be etched by a chemical mechanical polishing process. An etch process for forming contact holes 130 in the wafer WAFER or the semiconductor substrate 100 may be performed during subsequent processes. When the thickness of the wafer WAFER or the semiconductor substrate 100 is reduced, an etch process of forming the contact holes 130 may be smoothly performed.

After the bottom surface of the semiconductor substrate 100 is etched, an insulating layer D_LAYER may be formed on the entire bottom surface of the semiconductor substrate 100. The insulating layer D_LAYER may be formed over the entire bottom surface of the wafer WAFER, and may include an oxide layer.

Subsequently, the insulating layer D_LAYER and the wafer WAFER may be etched to expose the inner pads INNER_PAD formed in the respective dies 10. As a result, the contact holes 130 may be formed through the wafer WAFER. The process for forming the contact holes 130 in the wafer WAFER may be performed while the wafer WAFER is turned over. The wafer WAFER may be supported by the carrier substrate CARRIER_SUB.

A dielectric film (not shown) is formed on a side wall of a contact hole 130 to prevent electrical or physical contact between a conductive material, which is to be formed in the contact hole 130, and the semiconductor substrate 100. The dielectric film is normally fabricated by a deposition process of a dielectric material and a Reactive on etching (RIE) process.

Figure 10:
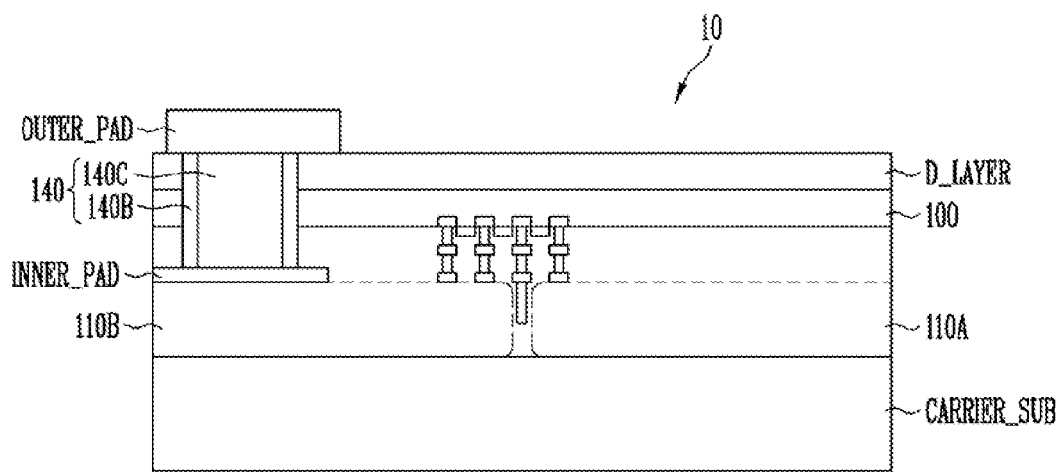
Figure 11:
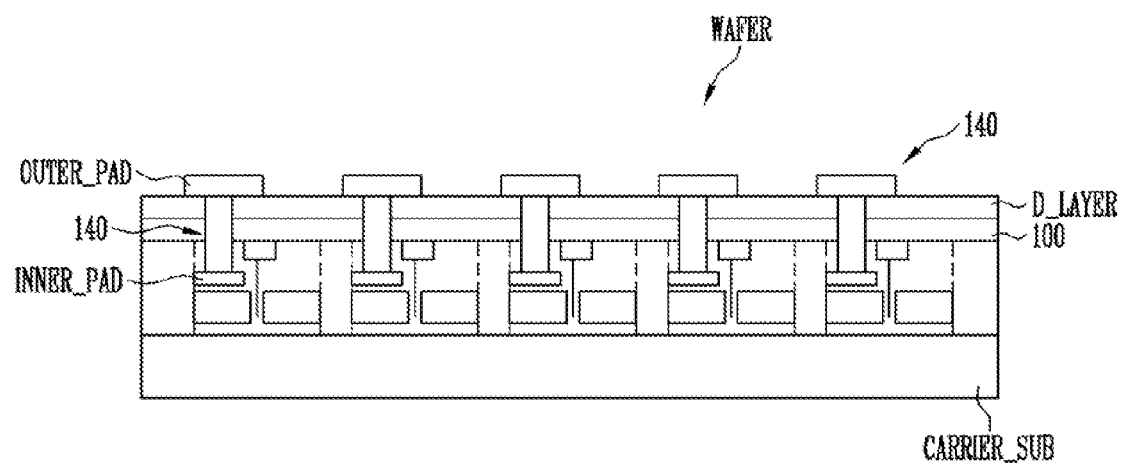
Figure 12:
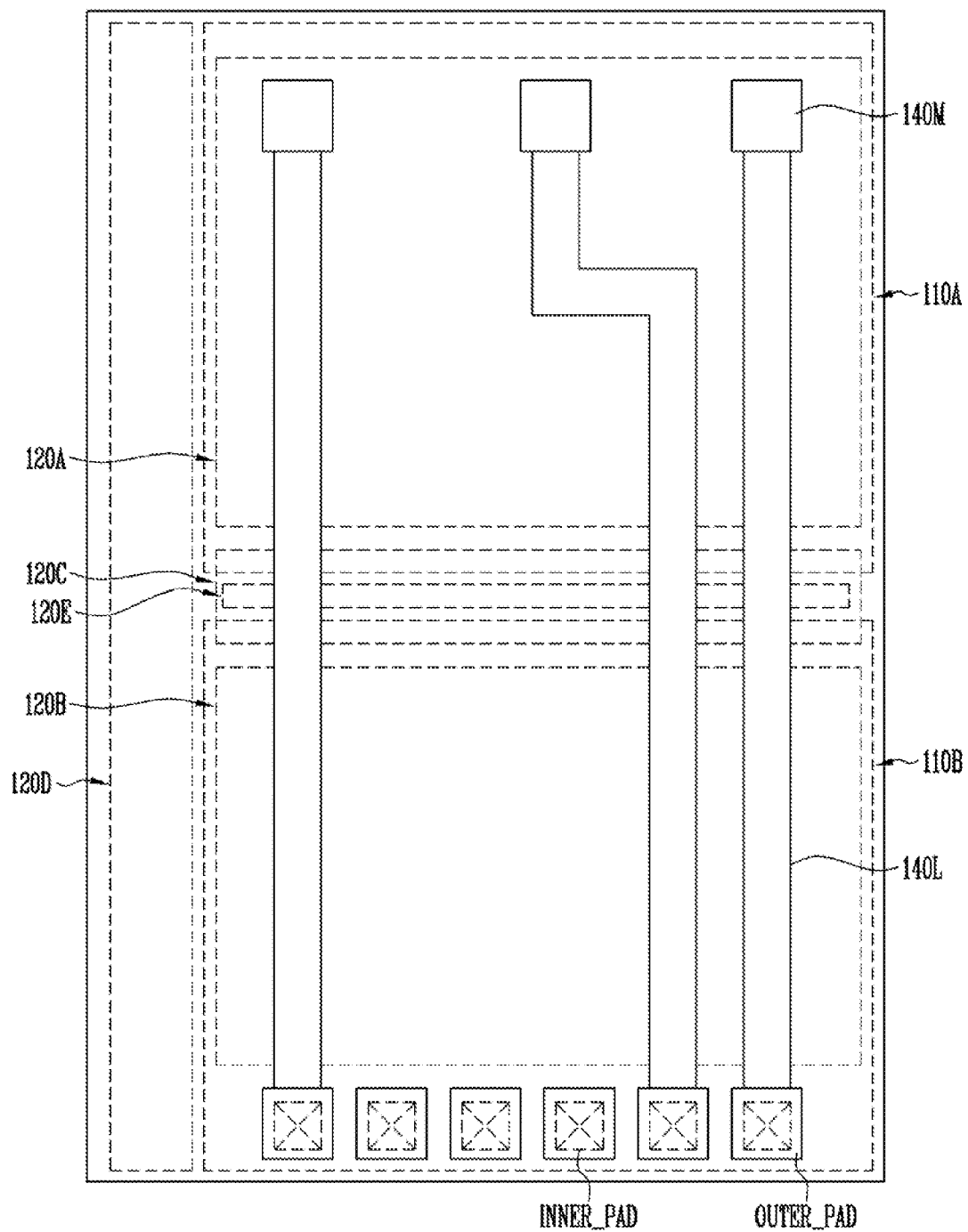

Referring to FIGS. 10 to 12, a barrier metal layer 140B may be formed in the contact holes 130, and the contact holes 130 may be filled with a conductive layer. The barrier metal layer 140B may include a titanium layer, a titanium nitride layer, or a multilayer structure including the titanium layer and the titanium nitride layer. The conductive layer forming a contact plug 140C may include copper or tungsten. Contact plugs 140C including the conductive layer may be formed in the contact holes 130 so that the contact plugs 140C may contact the inner pads INNER_PAD. A wiring structure 140 may be formed by the contact plugs 140C and the barrier metal layer 140B. Subsequently, an outer pad group including outer pads OUTER_PAD may be formed on the insulating layer D_LAYER including the wiring structure 140.

During formation of the contact plugs 140C or the outer pads OUTER_PAD, conductive layers 140L and 140M to form a contact plug coupled to the operation circuit 120A, an additional pad coupled to the contact plug, and wiring for coupling the additional pad to the outer pads OUTER_PAD, may be additionally formed in another region. The conductive layers 1401, and 140M may function as metal lines for supplying various power sources to the operation circuits.

As a result, the outer pads OUTER_PAD coupled to the inner pads INNER_PAD through the wiring structure 140 may be formed on the bottom surface of the wafer WAFER or the semiconductor substrate 100.

Figure 13:
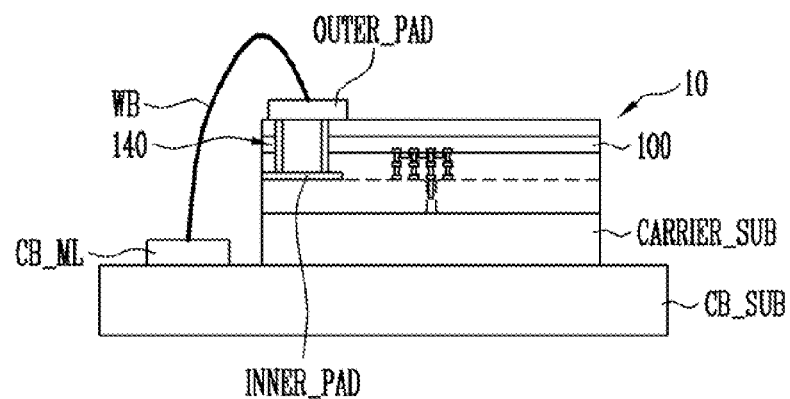

Referring to FIG. 13, each of the dies 10 may be separated from the wafer WAFER, and each die 10 may be attached to a circuit board CB_SUB. The first die 10 may be turned over and attached to the circuit board CB_SUB so that the outer pads OUTER_PAD may be exposed at the top surface of the die 10. Therefore, the carrier substrate CARRIER_SUB of the die 10 may contact the circuit board CB_SUB.

The outer pads OUTER_PAD of the die 10 may be coupled to a metal line CB_ML of the circuit board CB_SUB by a connecting member such as a wire WB.

The inner pads INNER_PAD may be formed between the semiconductor substrate and the memory arrays, and the inner pads INNER_PAD may be coupled to the circuit board CB_SUB through the wiring structure 140, the outer pads OUTER_PAD, and the wire WB. Therefore, the inner pads INNER_PAD may be coupled to the circuit board CB_SUB without affecting the area where the memory arrays are formed. Therefore, the area where the memory arrays are formed may be increased within a predetermined space of the semiconductor substrate. As a result, the number of memory cells formed in the semiconductor substrate may be increased, and data storage capacity may be increased.

Referring to FIG. 14, when the plurality of semiconductor substrates or the dies 10 are stacked over the circuit board CB_SUB, the dies 10 may be turned over. In other words, the dies 10 may be stacked over the circuit board CB_SUB so that the insulating layer D_LAYER formed on the bottom surface of the semiconductor substrate 100 may be located above the protective plate or the carrier substrate CARRIER_SUB formed on the top surface of the semiconductor substrate 100. As a result, the insulating layer D_LAYER of the underlying semiconductor substrate 100 and the protective plate or the carrier substrate CARRIER_SUB of the overlying semiconductor substrate 100 may face each other. In addition, the semiconductor substrates 100 or the dies 10 may be offset from each other to expose the outer pads OUTER_PAD.

The outer pads OUTER_PAD of the stacked semiconductor substrate 100 or dies 10 may be coupled to the metal line CB_ML of the circuit board CB_SUB by coupling members such as the wire WB.

Hereinafter, a packaging process of the semiconductor substrate according to another embodiment is described below. FIGS. 15 to 22 are views illustrating a packaging process of a semiconductor device according to another embodiment of the present invention.

Figure 15:
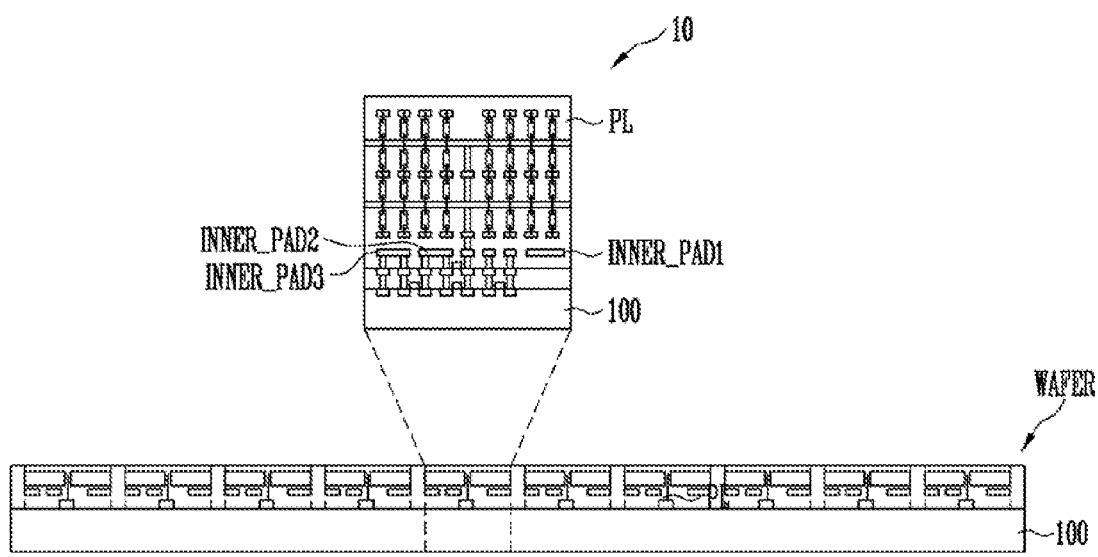
FIGS. 15 to 22 are views illustrating a packaging process of a semiconductor device according to another embodiment of the present invention.

Referring to FIG. 15, the semiconductor substrate 100 described above with reference to FIGS. 5A and 53 may be provided. In other words, an inner pad INNER_PAD1 may be formed under the memory array 1106 in the pad region. In addition, inner pads INNER_PAD2 and INNER_PAD3 may be further formed under the memory array 110A in the first operation circuit region.

The passivation layer PL may be formed on the semiconductor substrate 100, on which the inner pads INNER_PAD1 to INNER_PAD3 are formed. The semiconductor substrate 100 may be a single die 10 in the wafer WAFER. A plurality of dies 10 may be formed in the wafer WAFER.

Figure 16:
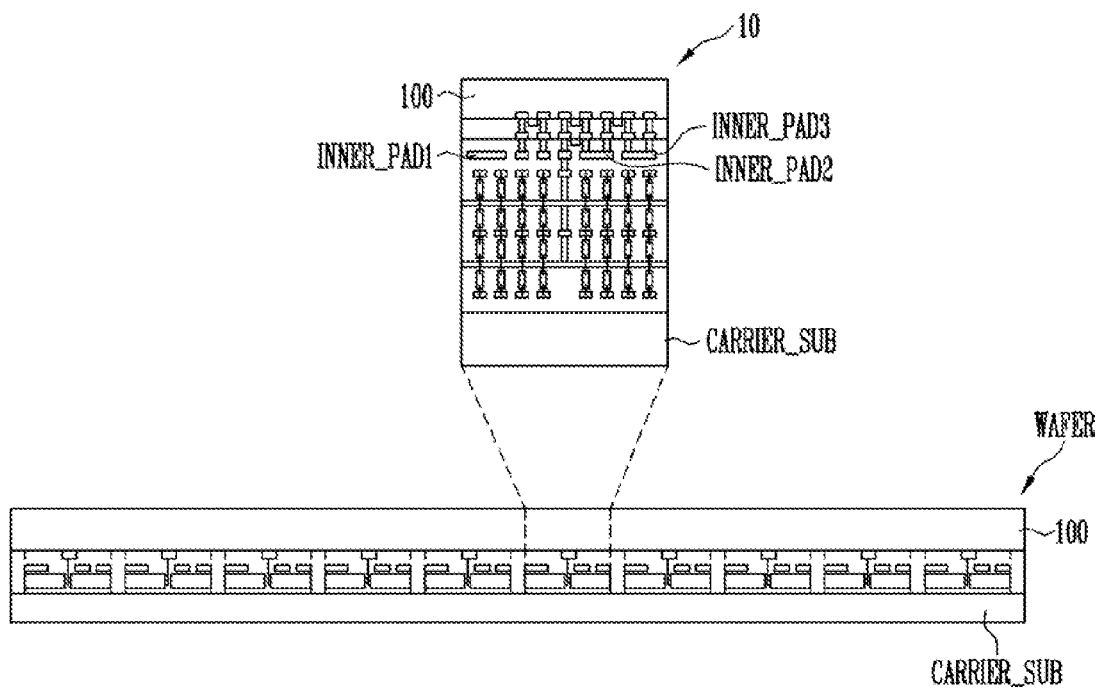

Referring to FIG. 16, the carrier substrate CARRIER_SUB may be attached to a top surface of the wafer WAFER, i.e., to the passivation layer PL formed in each die 10. The carrier substrate CARRIER_SUB may also serve as a protective plate for protecting the top surface of the wafer WAFER where the memory arrays are formed. The wafer WAFER may be turned over and attached to the carrier substrate CARRIER_SUB. After the carrier substrate CARRIER_SUB is attached to the wafer WAFER, the wafer WAFER may be turned over.

Figure 17:
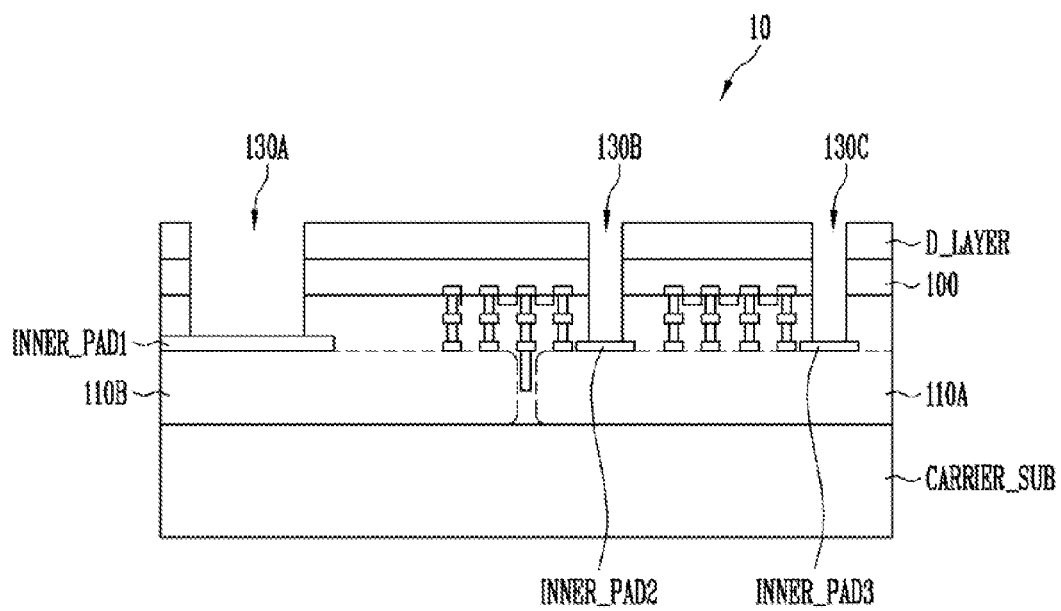
Figure 18:
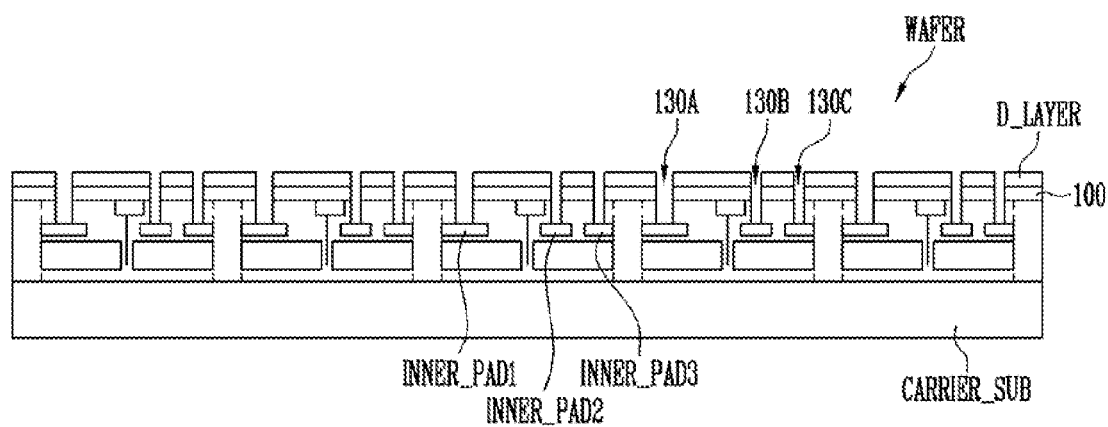

Referring to FIGS. 17 and 18, the processes described above with reference to SIGs. 8 and 9 may be performed. In other words, in order to reduce the thickness of the wafer WAFER or the semiconductor substrate 100, the entire bottom surface of the wafer WAFER or the semiconductor substrate 100 may be etched. The insulating layer D_LAYER may be formed over the entire bottom surface of the wafer WAFER or the semiconductor substrate 100 after the etch process.

Subsequently, the insulating layer D_LAYER and the wafer WAFER may be etched to expose the inner pads INNER_PAD1 to INNER_PAD3 formed on each die 10. As a result, contact holes 130A to 130C formed through the semiconductor substrate 100 may be formed in each die 10 of the wafer WAFER.

Figure 19:
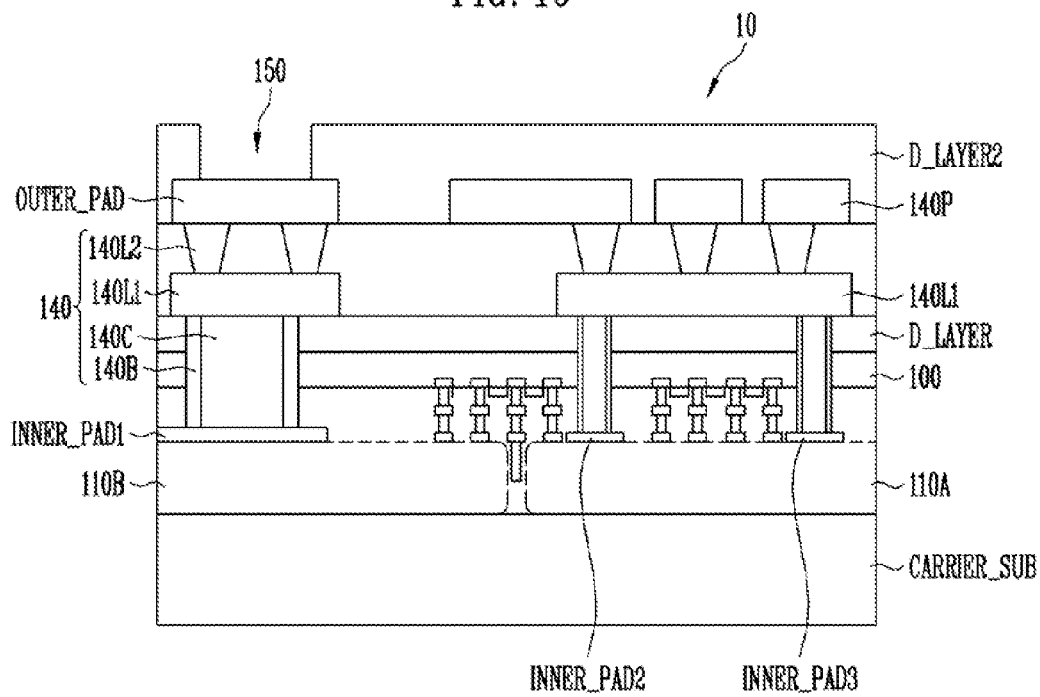
Figure 20:
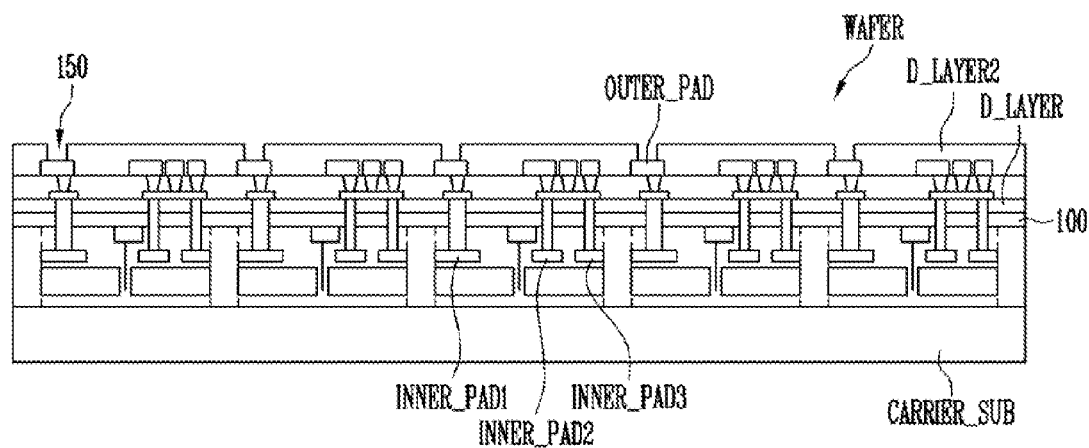
Figure 21:
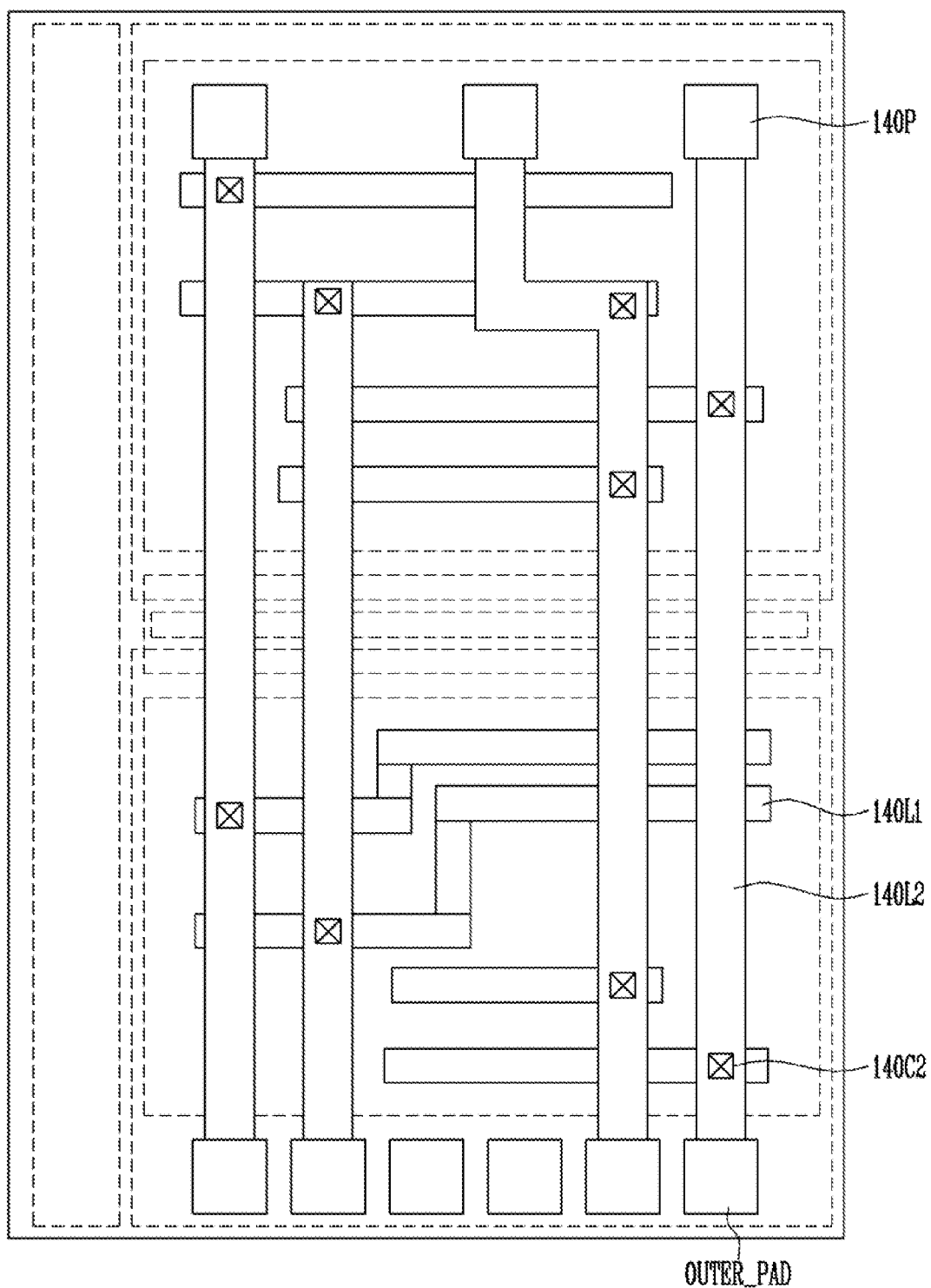

Referring to FIGS. 19 to 21, the barrier metal layer 140B may be formed in the contact holes 130A to 130C, and contact plugs 140C1 may be formed in the contact holes 130A to 130C. The contact plugs 140C1 may contact the inner pads INNER_PAD1 to INNER_PAD3.

Multilayer metal lines 140L1 and 140C2 may be formed on the wafer WAFER, in which the contact plugs 140C1 are formed. As a result, the wiring structure 140 may include the contact plugs 140C1 and the multilayer metal lines 140L1 and 140C2.

Subsequently, an outer pad group including the outer pads OUTER_PAD may be formed on the insulating layer D_LAYER including a wiring structure 140. During formation of the outer pads OUTER_PAD, conductive layers 140L2 and 140P for forming wiring or pads may be additionally formed in another region. The conductive layers 140L2 and 140P may also be included in the multilayer wiring 140. Therefore, the outer pads OUTER_PAD may be coupled to the uppermost metal line 140L2 among the multilayer metal lines 140L1, 140C2, 140L2 and 140P. The conductive layers 140L2 and 140P may function as metal lines for supplying various power sources to the operation circuits.

In the wiring structure, the contact plugs 140C1 may include copper or tungsten. The multilayer metal lines 140L1, 140L2 and 140P may include aluminum. Plugs 140C2 that vertically couple the multilayer metal lines 140L1, 140L2 and 140P may include aluminum or copper.

Annealing at a temperature of 900° C. or higher may be performed to increase the grain size of a vertical channel included in three-dimensionally structured memory strings in order to increase cell current. However, after a process of manufacturing a semiconductor device, which includes high-temperature annealing, is completed, the wiring structure 140 may be formed using copper or aluminum through a Through Silicon Via (TSV) process, so that the wiring structure 140 may be prevented from being damaged.

The insulating layer D_LAYER including contact holes, through which the outer pads OUTER_PAD are exposed, may be further formed on the bottom surface of the wafer WAFER, on which the outer pads OUTER_PAD are formed.

Figure 22:
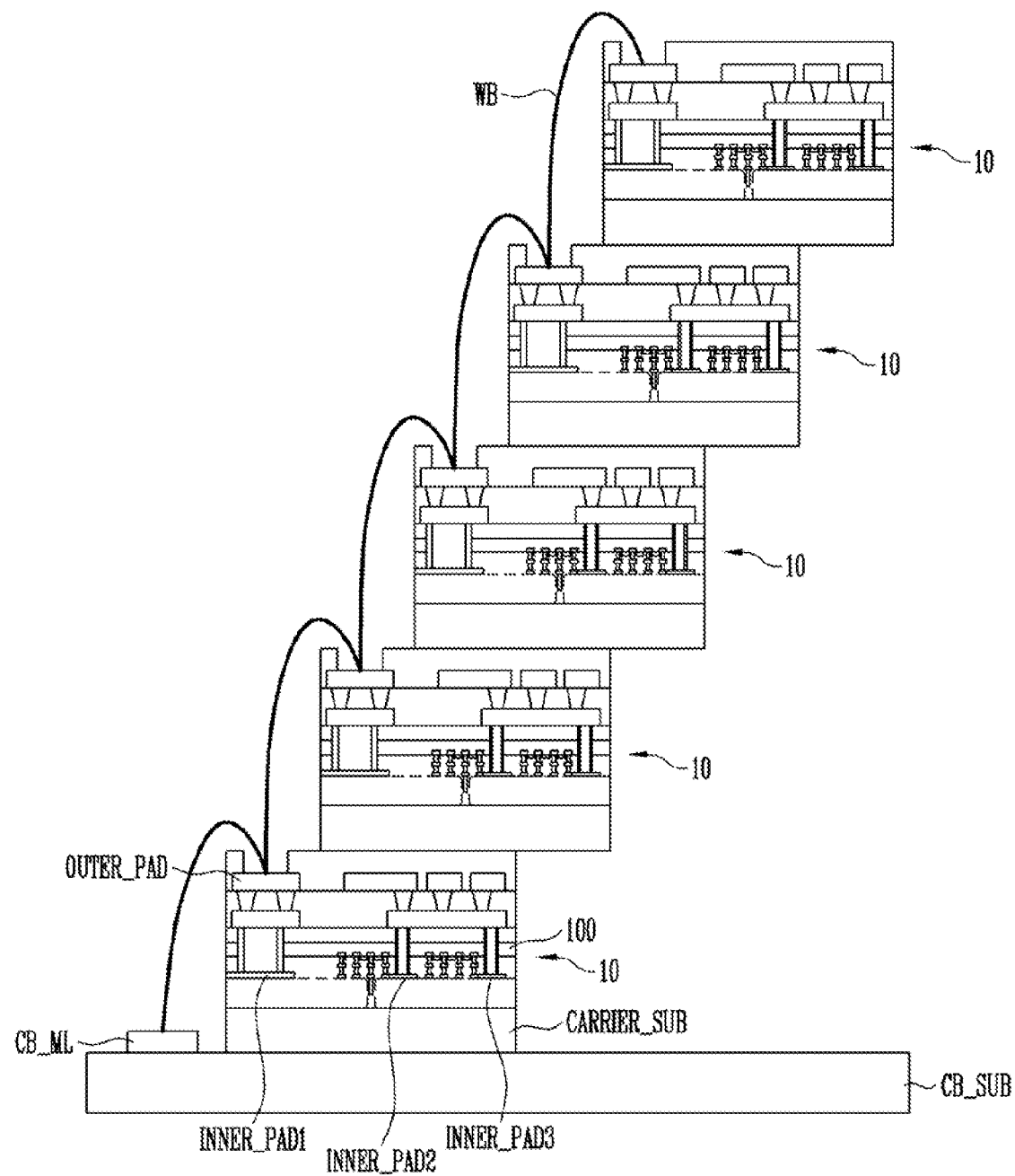

Referring to FIG. 22, each of the dies 10 may be separated from each other in the wafer WAFER, and the dies 10 shown in FIG. 19 may be attached to the circuit board CB_SUB. Each of the dies 10 may be turned over, and attached to the circuit board CB_SUB so that the outer pads OUTER_PAD may be exposed at the top thereof. As a result, the insulating layer D_LAYER of the underlying semiconductor substrate 100 and the protective plate or the carrier substrate CARRIER_SUB of the semiconductor substrate 100 may face each other. In addition, the semiconductor substrates 100 or the dies 10 may be offset from each other to expose the outer pads OUTER_PAD. The outer pads OUTER_PAD of the dies 10 may be coupled to the metal line CB_ML of the circuit board CB_SUB by a connecting member such as the wire WB.

Figure 23:
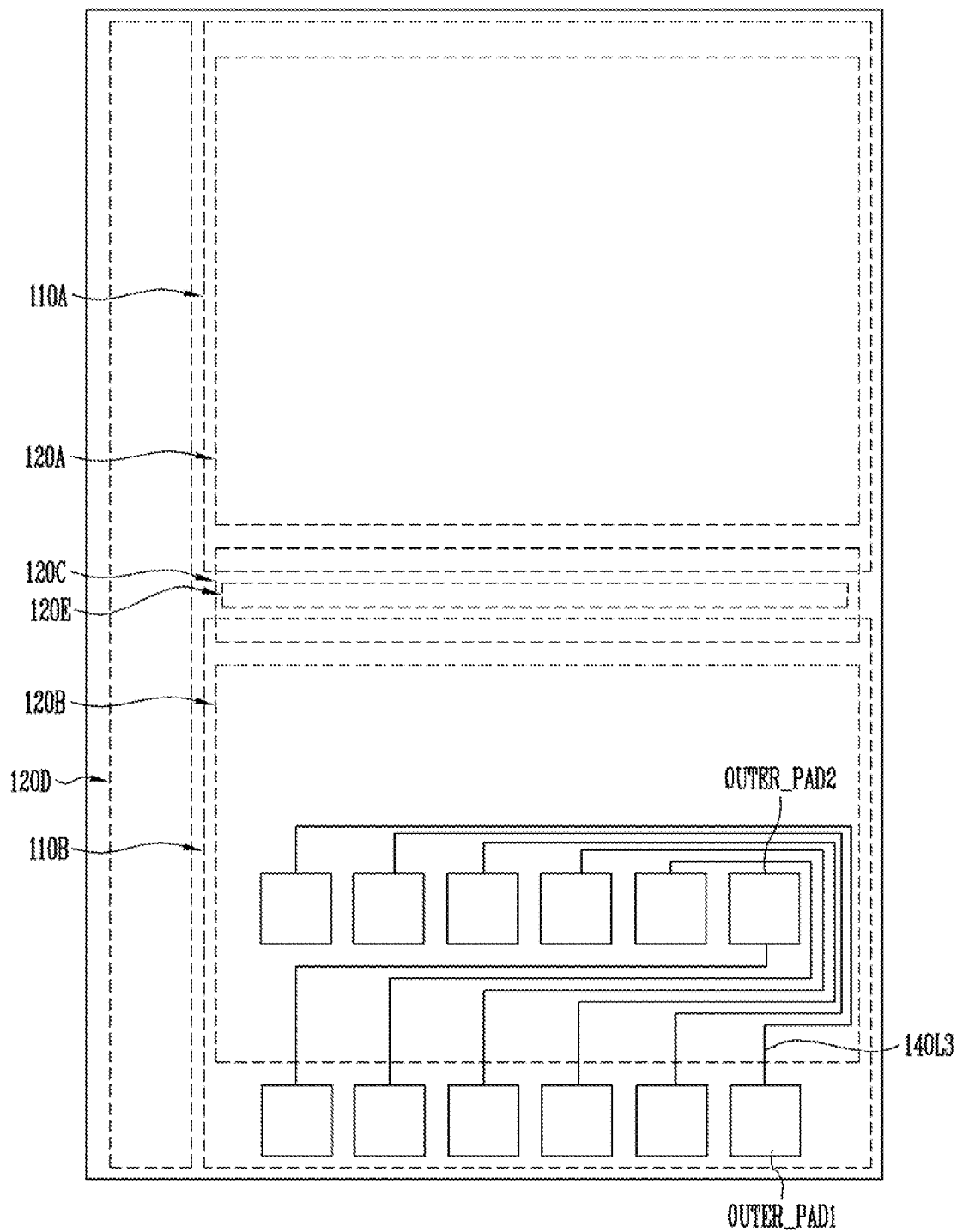
FIGS. 23 and 24 are views illustrating a packaging process of a semiconductor device according to another embodiment of the present invention.
Figure 24:
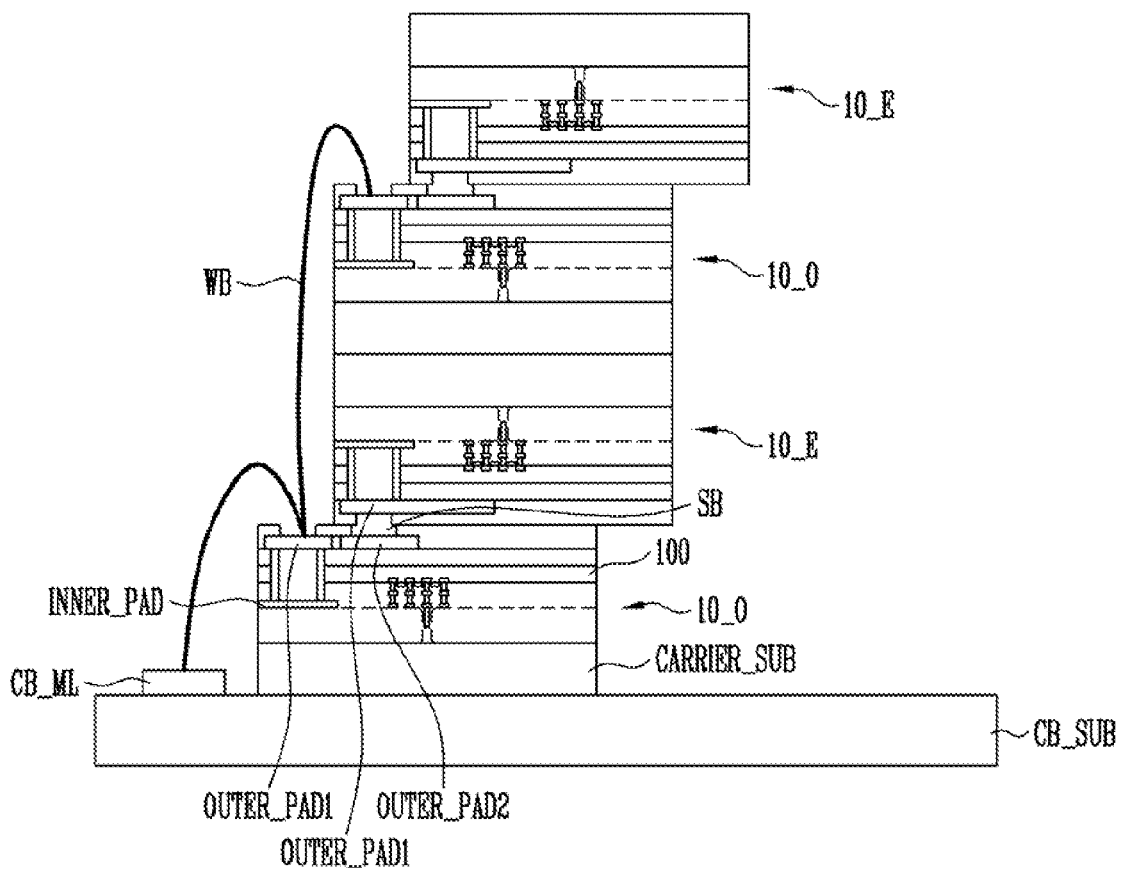

Hereinafter, a packing process of the semiconductor substrate according to another embodiment is described below. FIGS. 23 and 24 are views illustrating a packaging process of the semiconductor device according to another embodiment of the present invention.

Referring to FIG. 23, when outer pads are formed after formation of the wiring structure 140 as described above with reference to FIG. 10 or 19, other outer pads may be further formed. A detailed description thereof is as follows.

As illustrated in FIG. 10 or 19, after the wiring structure 140 is formed on the semiconductor substrate 100, the first outer pads OUTER_PAD1 coupled to the inner pads through the wiring structure 140 may be formed on the semiconductor substrate 100. Second outer pads OUTER_PAD2, which are the same as the first outer pads OUTER_PAD1 may be further formed. In addition, metal lines 140L3 for electrically coupling the first outer pads OUTER_PAD1 and the second outer pads OUTER_PAD2 may be further formed. The second outer pads OUTER_PAD2 may be formed to be coupled to another semiconductor substrate 100, not the circuit board CB_SUB.

Referring to FIG. 24, dies 10_O and 10_E including the first and second outer pads OUTER_PAD1 and OUTER_PAD2 described with reference to FIG. 23 may be stacked over the circuit board CB_SUB. The semiconductor substrates 100 described with reference to FIG. 23 may be the dies 10_O and 10_E. Only the dies 10_O in the odd layers may be turned over so that the bottom surfaces of the semiconductor substrates 100, on which the outer pads OUTER_PAD1 and OUTER_PAD2 are formed, may be located at the top thereof.

The die 10_O in the odd layer and the die 10_E in the even layer may be stacked and offset from each other so that the second outer pad group OUTER_PAD2 of the die 10_O in the odd layer and the first outer pad group OUTER_PAD1 of the die 10_E in the even layer, which is located on the die 10_O in the odd layer, may face each other. As a result, the second outer pad group OUTER_PAD2 of the die 10_O in the odd layer and the first outer pad group OUTER_PAD1 of the die 10_E in the even layer, which is located on the die 10_O in the odd layer, may be coupled to each other by a connecting member SB.

The first outer pad groups OUTER_PAD1 of the dies 10_O in the odd layers may be coupled to the metal line CB_ML of the circuit board CB_SUB by connecting members such as the wires WB. The first outer pad group OUTER_PAD1 of the die 10_E in the even layer may be electrically coupled to the wire WB through the second outer pad group OUTER_PAD2 of the die 10_O in the odd layer, the metal lines 140L3 shown in FIG. 23, and the first outer pad group OUTER_PAD1.

As described above, only the dies 10_O in the odd layers are turned over, the dies 10_O and 10_E in the odd and even layers may be electrically connected to the metal line CB_ML of the circuit board CB_SUB by using the first and second outer pads OUTER_PAD1 and OUTER_PAD2 so that an increase in chip size may be prevented despite an increase in the number of stacked dies.

Figure 25:
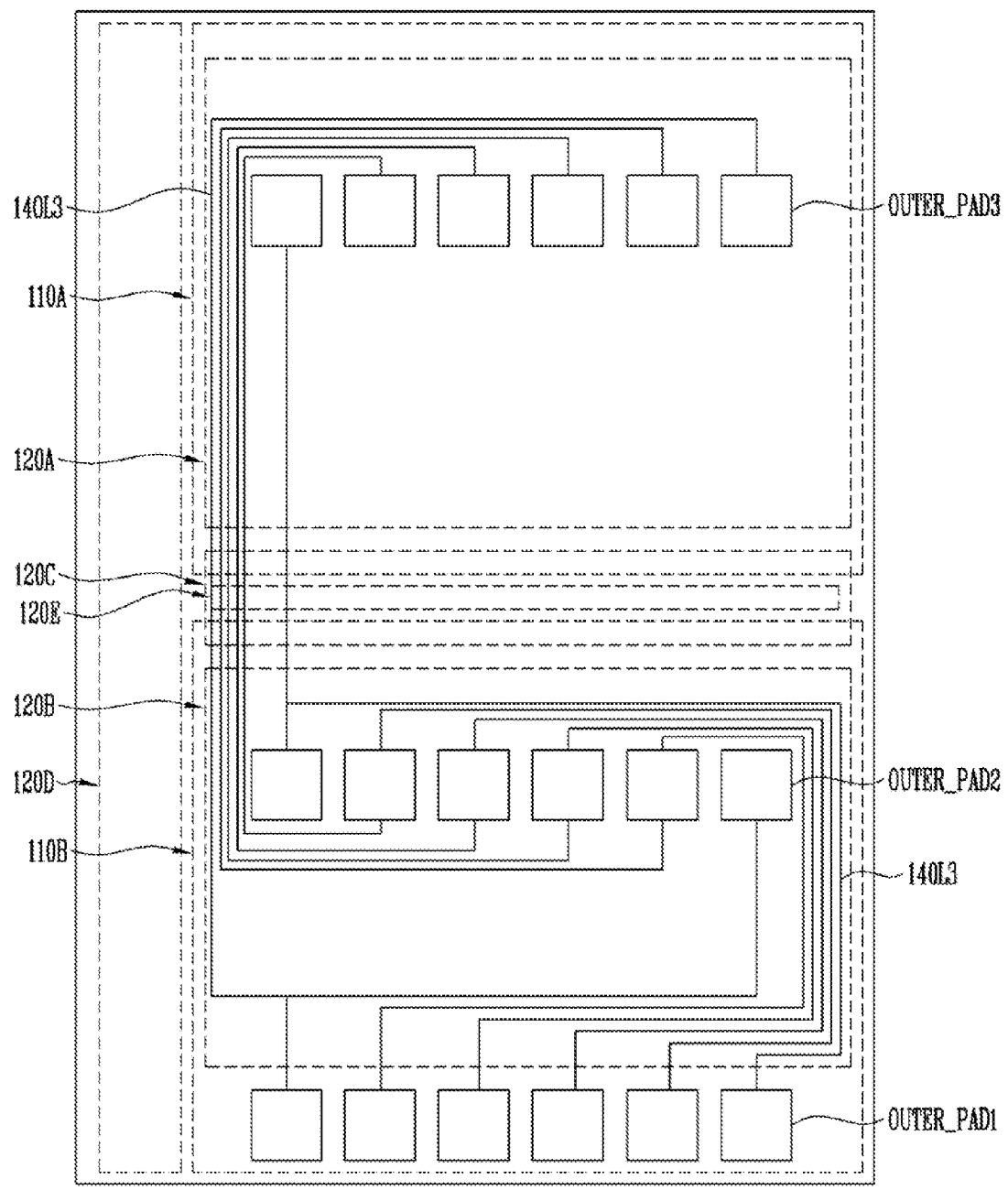
FIGS. 25 and 26 are views illustrating a packaging process of a semiconductor device according to another embodiment of the present invention.
Figure 26:
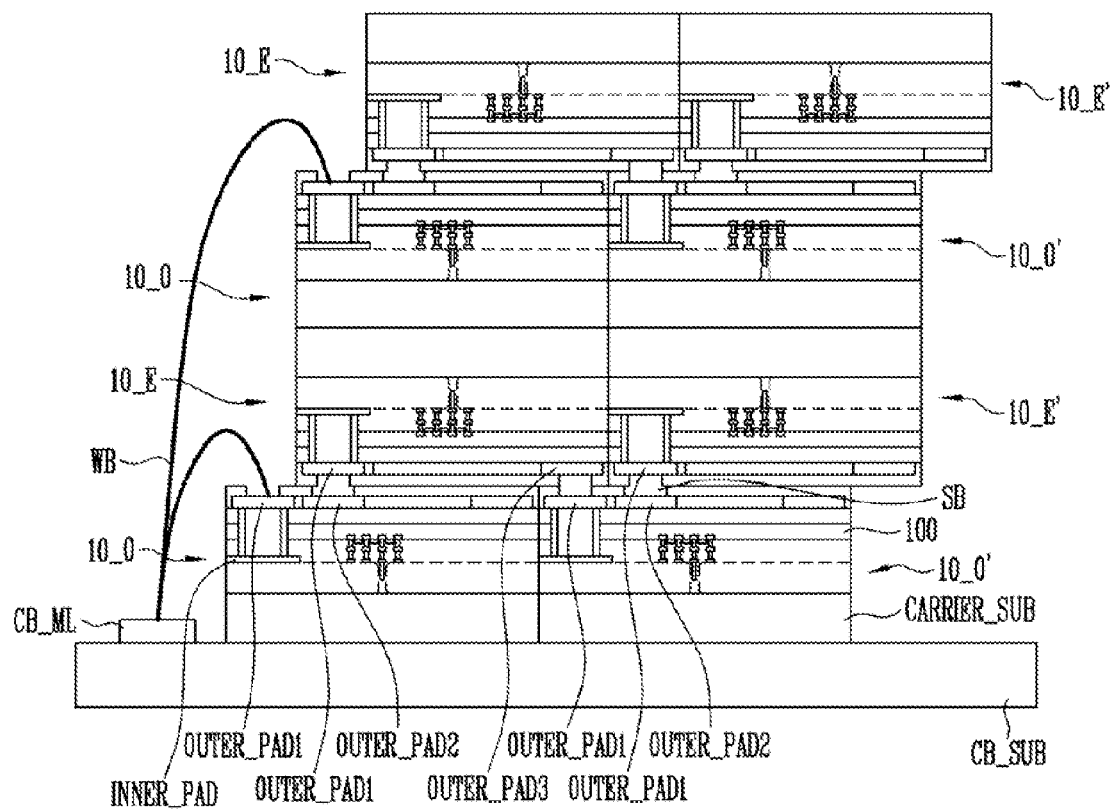

Hereinafter, a packing process of the semiconductor substrate according to an embodiment of the present invention is described. FIGS. 25 and 26 are views illustrating a packaging process of the semiconductor device according to an embodiment of the present invention.

Referring to FIG. 25, when the outer pads OUTER_PAD1 are formed after the wiring structure 140 is formed, as illustrated in FIG. 10 or 19, other outer pads OUTER_PAD2 and OUTER_PAD3 may be further formed. A detailed description thereof is as follows.

As described above with reference to FIG. 10 or 19, after the wiring structure 140 is formed over the semiconductor substrate 100, the first outer pads OUTER_PAD1 coupled to the inner pads INNER_PAD through the wiring structure 140 may be formed over the semiconductor substrate 100. The second and third outer pads OUTER_PAD2 and OUTER_PAD3, which are the same as the first outer pads OUTER_PAD1, may be further formed. In addition, the metal lines 140L3 for electrically coupling the outer pads OUTER_PAD1 to OUTER_PADS may be further formed. The second and third outer pads OUTER_PAD2 and OUTER_PAD3 may be formed to establish electrical connections to other semiconductor substrates 100, not to the circuit board CB_SUB.

Referring to FIG. 26, dies 10_O, 10_O', 10_E, and 10_E' including the first to third outer pads OUTER_PAD1 to OUTER_ PAD3 described with reference to FIG. 25 may be stacked over the circuit board CB_SUB. The semiconductor substrates 100 described with reference to FIG. 25 may be the dies 10_O, 10_O', 10_E, and 10_E'. Two or more of the dies 10_O, 10_O', 10_E, and 10_E' may be formed in an odd or even layer. In addition, the dies 10_O and 10_O' in an odd layer may be turned over so that bottom surfaces of the semiconductor substrates 100, on which the outer pads OUTER_PAD1 and OUTER_PAD2 are formed, may be located at the top thereof.

The die 10_O in the odd layer and the die 10_E in an even layer may be stacked and offset from each other so that the second outer pad group OUTER_PAD2 of the die 10_O in the odd layer and the first outer pad group OUTER_PAD1 of the die 10_E in the even layer, which is located on the die 10_O in the odd layer, may face each other. In addition, the die 10_O' in the odd layer and the die 10_E in the even layer may be offset from each other so that the first outer pad group OUTER_PAD1 of the die 10_3' in the odd layer and the third outer pad group OUTER_PAD3 of the die 10_E in the even layer, which is located on the die 10_O' in the odd layer, may face each other. In addition, the die 10_O' in the odd layer and the die 10_E' in the even layer may be offset from each other so that the second outer pad group OUTER_PAD2 of the die 10_O' in the odd layer and the first outer pad group OUTER_PAD1 of the die 10_E' in the even layer, which is located on the die 10_O' in the odd layer, may face each other.

As a result, the second outer pad group OUTER_PAD2 of the die 10_O in the odd layer and the first outer pad group OUTER_PAD1 of the die 10_E in the even layer may be coupled to each other by the connecting member SB. In addition, the first outer pad group OUTER_PAD1 of the die 10_O' in the odd layer and the third outer pad group OUTER_PADS of the die 10_E in the even layer may be coupled to each other by the connecting member SB. In addition, the second outer pad group OUTER_PAD2 of the die 10_O' in the odd layer and the first outer pad group OUTER_PAD1 of the die 10_E' in the even layer may be coupled to each other by the connecting member SB. As described above, the die, e.g., the die 10_O' may be electrically connected to two dies 10_E and 10_E' located thereon or thereunder through two of the first to third outer pad groups OUTER_PAD1 to OUTER_PAD3.

The first outer pad groups OUTER_PAD1 of the dies 10_O in the odd layers may be coupled to the metal line CB_ML of the circuit board CB_SUB by connecting members such as the wires WB. The first outer pad groups OUTER_PAD1 of the dies 10_E in the even layers may be electrically connected to the wires WB through the second outer pad groups OUTER_PAD2, the metal lines 140L3 shown in FIG. 23, and the first outer pad groups OUTER_PAD1 of the dies 10_O in the odd layers, respectively.

The first outer pad group OUTER_PAD1 of the die 10_O" in the odd layer may be coupled to the metal line CB_ML of the circuit board CB_SUB through the outer pad groups OUTER_PAD1 to OUTER_PAD3 of the die 10_E in the even layer, the first and second outer pad groups OUTER_PAD1 and OUTER_PAD2 of the die 10_O in the odd layer, and the wire WB. The first outer pad group OUTER_PAD1 of the die 10_E' in the even layer may be coupled to the metal line CB_ML of the circuit board CB_SUB through the first and second outer pad groups OUTER_PAD1 and OUTER_PAD2 of the die 10_O' in the odd layer, the outer pad groups OUTER_PAD1 to OUTER_PAD3 of the die 10_E in the even layer, the first and second outer pad groups OUTER_PAD1 and OUTER_PAD2 of the die 10_O in the odd layer, and the wire WB.

In other words, the wires WB may couple the first outer pads OUTER_PAD1 of the dies 100 in the odd layers to the metal line CB_ML of the circuit board CB_SUB and the first outer pads OUTER_PAD1 of other dies 10_O', 10_E and 10_E' may be coupled to the wires WB through outer pads of other dies.

As described above, since a plurality of dies are arranged in each layer, only the dies 10_O in the odd layers are turned over, and the dies 10_O, 10_E, 10_O', and 10_E' in the odd and even layers are electrically coupled to the metal line CB_ML of the circuit board CB_SUB by using the first to third outer pads OUTER_PAD1 and OUTER_PAD3, an increase in chip size may be further prevented despite an increase in the number of stacked dies.

Figure 27:
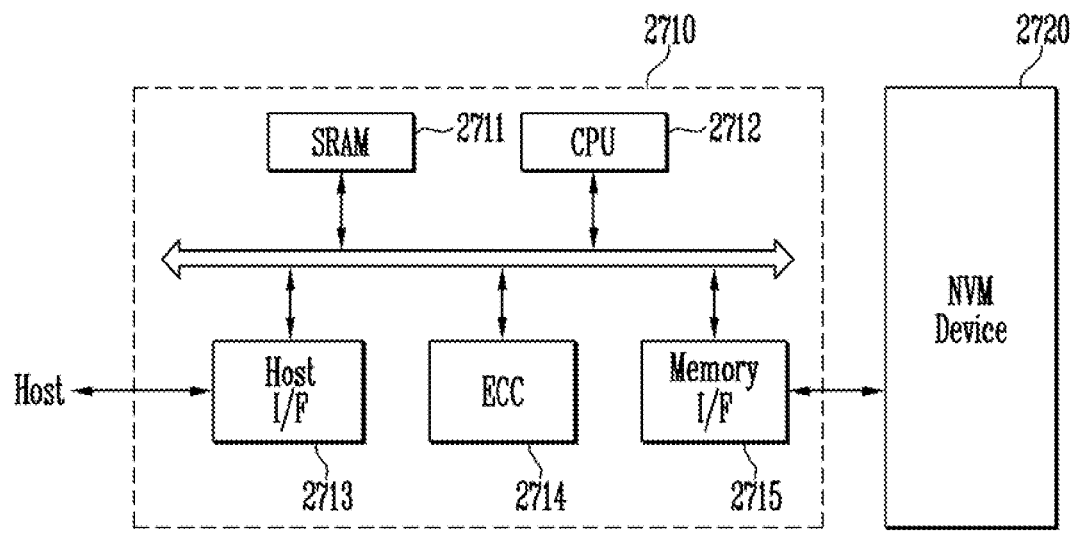
FIG. 27 is a schematic block diagram illustrating a memory system according to an embodiment of the present invention.

FIG. 27 is a schematic block diagram illustrating a memory system according to an embodiment of the present invention.

As illustrated in FIG. 27, a memory system 2700 according to an embodiment of the present invention may include a non-volatile memory device 2720 and a memory controller 2710.

The non-volatile memory device 2720 may include the above-described semiconductor memory. The memory controller 2710 may control the non-volatile memory device 2720 in a general operation mode such as a program loop, a read operation, or an erase loop.

The memory controller 2710 may be a solid state disk (SSD) or a memory card in which the non-volatile memory device 2720 and the memory controller 2710 are combined. SRAM 2711 may function as an operation memory of a processing unit 2712. A host interface 2713 may include a data exchange protocol of a host being coupled to the memory system 2700. An error correction block 2714 may detect and correct errors included in a data read from the non-volatile memory device 2720. A memory interface 2714 may interface with the non-volatile memory device 2720. The processing unit 2712 may perform the general control operation for data exchange of the memory controller 2710.

Though not shown in FIG. 27, the memory system 2700 may further include ROM (not illustrated) that stores code data to interface with the host. In addition, the non-volatile memory device 2720 may be a multi-chip package composed of a plurality of flash memory chips. The memory system 2700 having the above-described configuration may be provided as a storage medium having high reliability and low error rate. When a flash memory device according to an embodiment of the present invention is provided in a memory system such as a semiconductor disk device (solid state disk (SSD)), on which research has been actively conducted, the memory controller 2710 may communicate with an external device (e.g., a host) through one of various interface protocols, such as USB, MMC, PCI-E, SATA, PATH, SCSI, ESDI and IDE.

Figure 28:
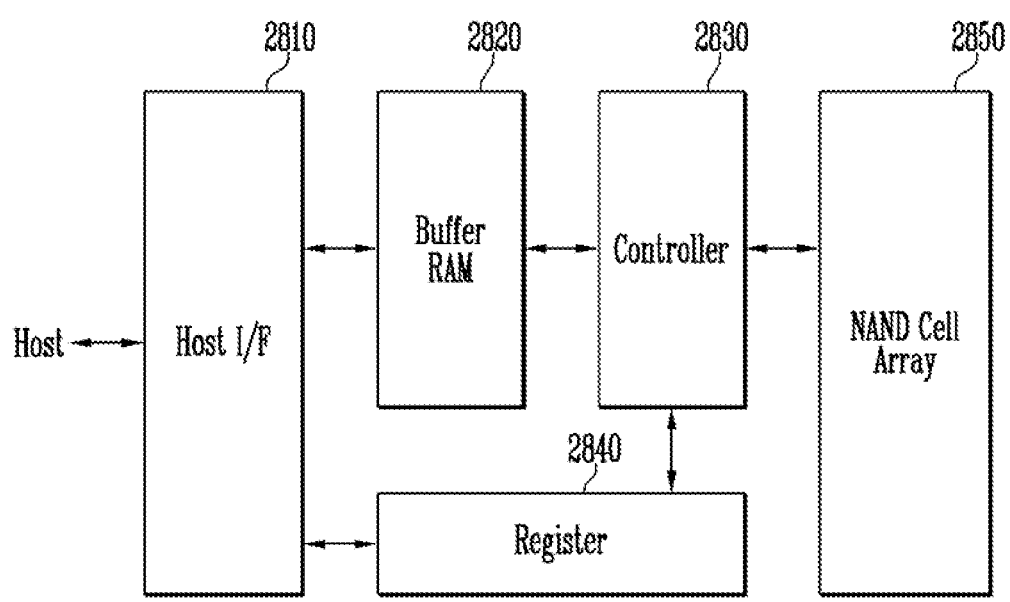
FIG. 28 is a schematic block diagram illustrating a fusion memory device or a fusion memory system according to a program operation according to the earlier described various embodiments.

FIG. 28 is a schematic block diagram illustrating a fusion memory device or a fusion memory system performing a program operation according to the earlier described embodiments. For example, technical features of the present invention may be applied to a OneNAND flash memory device 2800 as a fusion memory device.

The OneNand flash memory device 2800 may include a host interface (I/F) 2810, a buffer RAM 2820, a controller 2830, a register 2840 and a NAND flash cell array 2850. The host interface 2810 may exchange various types of information with a device using different protocols. The buffer RAM 2820 may be loaded with codes for driving the memory device or temporarily store data. The controller 2830 may control read and program operations in every state in response to a control signal and a command that are externally given. The register 2840 may store data including instructions, addresses and configurations defining a system operating environment in the memory device. The NAND flash cell array 2850 may include operating circuits including non-volatile memory cells and page buffers. The memory array illustrated in FIGS. 4A and 4B may be applied as a memory array of the NAND flash cell array 2850.

Figure 29:
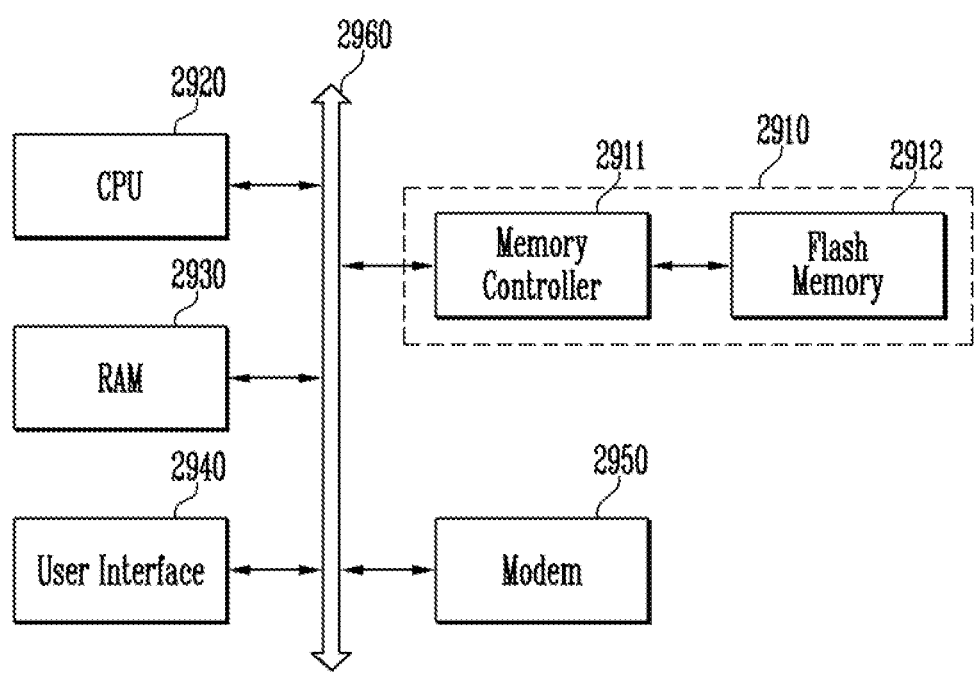
FIG. 29 is a schematic block diagram illustrating a computing system including a flash memory device according to an embodiment of the present invention.

FIG. 29 is a schematic view illustrating a computing system including a flash memory device 2912.

A computing system 2900 according to an embodiment of the present invention may include a microprocessor 2920, RAM 2930, a user interface 2940, a modem 2950, such as a baseband chipset, and a memory system 2910 that are electrically coupled to a system bus 2960. In addition, when the computing system 2900 is a mobile device, a battery (not illustrated) may be further included to apply an operating voltage to the computing system 2900. Though not shown in FIG. 29, the computing system 2900 may further include application chipsets, a camera image processor (CIS) and mobile DRAM. The memory system 2910 may form a solid state drive/disk (SSD) that uses a non-volatile memory device in order to store data. Alternatively, the memory system 2910 may be provided as a fusion memory flash memory e.g., OneNAND flash memory).

According to the present invention, the number of memory cells formed on a semiconductor substrate may be increased, and an increase in size of a semiconductor chip depending on the number of stacked semiconductor substrates may be reduced.

It will be apparent to those skilled in the art that the above exemplary embodiments of the present invention may be implemented by a program or a recording medium, in which the program is recorded, configured to perform functions corresponding to the constitution of the embodiments, as well as the device and method disclosed herein.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A semiconductor device, comprising:
an operation circuit formed over a top surface of a semiconductor substrate;
a memory array formed over a top surface of the operation circuit;
an inner pad group formed between the operation circuit and the memory array, and coupled to the operation circuit;
a first outer pad group formed under a bottom surface of the semiconductor substrate so that the semiconductor substrate is located between the inner pad group and the first outer pad group; and
a wiring structure passing through the semiconductor substrate, and coupling the inner pad group to the first outer pad group,
wherein the wiring structure comprises:
first plugs coupled to the inner pad group, and passing through the semiconductor substrate;
multilayer metal lines formed under the bottom surface of the semiconductor substrate, and electrically connected to the first plugs, wherein the first outer pad group is coupled to an uppermost metal line among the multilayer metal lines; and
a second outer pad group formed under the semiconductor substrate to establish an electrical connection to another semiconductor substrate, wherein the second outer pad group is electrically coupled to the first outer pad group.

2. The semiconductor device of claim 1, further comprising a protective plate formed over the memory array, and attached to the semiconductor substrate.

3. The semiconductor device of claim 1, further comprising an insulating layer formed under the bottom surface of the semiconductor substrate,
wherein the first outer pad group is formed under a bottom surface of the insulating layer.

4. The semiconductor device of claim 1, wherein the inner pad group is located under the memory array.

5. The semiconductor device of claim 1, wherein the wiring structure comprises:
plugs passing through the semiconductor substrate to couple the inner pad group to the first outer pad group; and
conductive layers forming a contact plug coupled to the operation circuit, an additional pad coupled to the contact plug, and wiring coupling the additional pad to the first outer pad group.

6. The semiconductor device of claim 1, wherein the first plugs include copper or tungsten,
the multilayer metal lines include aluminum, and
the multilayer metal lines are vertically coupled by second plugs including aluminum or copper.

7. The semiconductor device of claim 1, further comprising a third outer pad group formed under the bottom surface of the semiconductor substrate to establish an electrical connection to another semiconductor substrate,
wherein the third outer pad group is electrically coupled to the first outer pad group or the second outer pad group.

8. A semiconductor device, comprising:
a circuit board;
semiconductor substrates each including an inner pad group, a memory array and an outer pad group, wherein the inner pad group and the memory array are sequentially stacked under each of bottom surfaces of the semiconductor substrates and the outer pad group is formed on each of top surfaces of the semiconductor substrates;
wiring structures respectively formed in the semiconductor substrates, wherein each of the wiring structures passes through each of the semiconductor substrates to couple the inner pad group to the outer pad group; and
connecting members each electrically coupling the circuit board to each of the outer pad group outside of the respective semiconductor substrates,
wherein the semiconductor substrates are stacked on the circuit board.

9. The semiconductor device of claim 8, further comprising:
a protective plate attached to a top surface of each of the semiconductor substrate; and
an insulating layer formed under each of the semiconductor substrate,
wherein the outer pad group is formed under the respective insulating layer.

10. The semiconductor device of claim 9, wherein the insulating layer and the protective plate, which are respectively located at top and bottom of the semiconductor substrate, face each other.

11. The semiconductor device of claim 8, wherein the semiconductor substrates are stacked and offset from each other so that the outer pad group of each of the semiconductor substrates is exposed.

12. The semiconductor device of claim 8, wherein each of the wiring structures comprises:
plugs passing through the semiconductor substrate and coupled to the inner pad group; and
conductive layers forming a contact plug coupled to the operation circuit, an additional pad coupled to the contact plug, and wiring coupling the additional pad to the outer pad group.

13. A semiconductor device, comprising:
a circuit board;
semiconductor substrates stacked on the circuit board and each including an inner pad group, a memory array, and first and second pad groups, wherein the inner pad group and the memory array are sequentially stacked on each of the semiconductor substrates and first and second outer pad groups are electrically coupled to each other and are formed under each of the semiconductor substrates;
wiring structures passing through the semiconductor substrates so that the inner pad group of each of the semiconductor substrates is coupled to the first outer pad group thereof, wherein each of the wiring structures is formed in each of the semiconductor substrates; and
connecting members each electrically coupling the circuit board to the first outer pad group outside of the semiconductor substrates in odd layers,
wherein the semiconductor substrates in even layers and the odd layers are alternately stacked on the circuit board, and the inner pad group or the first outer pad group each of the even and the odd layers face each other.

14. The semiconductor device of claim 13, wherein the semiconductor substrates in the odd layer and the semiconductor substrates in an even layer are stacked and offset from each other so that the second outer pad groups of the semiconductor substrates in the odd layer and the first outer pad groups of the semiconductor substrates in the even layer, which is located on the semiconductor substrate in the odd layer, face each other.

15. The semiconductor device of claim 13, wherein the second outer pad group of the semiconductor substrate in the odd layer and the first outer pad group of the semiconductor substrate in an even layer, which is located on the semiconductor substrate in the odd layer, are coupled to each other.

16. The semiconductor device of claim 13, wherein two or more of the semiconductor substrates are arranged in each of the odd layer and the even layer.

17. The semiconductor device of claim 16, further comprising a third outer pad group formed under a bottom surface of the semiconductor substrates, and electrically connected to the first outer pad group or the second outer pad group.

18. The semiconductor device of claim 17, wherein the semiconductor substrate is electrically coupled to two semiconductor substrates located thereon or thereunder through two of the first to third outer pad groups.

* * * * *